US012614120B2

(12) United States Patent
John et al.

(10) Patent No.: US 12,614,120 B2
(45) Date of Patent: Apr. 28, 2026

(54) FIELD PROGRAMMABLE GATE ARRAY ARCHITECTURE OPTIMIZED FOR MACHINE LEARNING APPLICATIONS

(71) Applicant: Board of Regents, The University of Texas System, Austin, TX (US)

(72) Inventors: Lizy Kurian John, Austin, TX (US); Aman Arora, Cedar Park, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 1065 days.

(21) Appl. No.: 17/763,739

(22) PCT Filed: Sep. 29, 2020

(86) PCT No.: PCT/US2020/053209
§ 371 (c)(1),
(2) Date: Mar. 25, 2022

(87) PCT Pub. No.: WO2021/067230
PCT Pub. Date: Apr. 8, 2021

(65) Prior Publication Data
US 2022/0327434 A1 Oct. 13, 2022

Related U.S. Application Data

(60) Provisional application No. 62/908,127, filed on Sep. 30, 2019.

(51) Int. Cl.
*G06N 20/20* (2019.01)
*G06N 3/048* (2023.01)
(Continued)

(52) U.S. Cl.
CPC ............. *G06N 20/20* (2019.01); *G06N 3/048* (2023.01); *H03K 19/17704* (2013.01); *H03K 19/17728* (2013.01)

(58) Field of Classification Search
CPC .. G06N 20/20; G06N 3/048; H03K 19/17704; H03K 19/17728
(Continued)

(56) References Cited

U.S. PATENT DOCUMENTS

| | | | |
|---|---|---|---|
| 6,986,021 B2 | 1/2006 | Master et al. | |
| 10,517,540 B1 * | 12/2019 | Anderson | ................ A61B 5/30 |
| 10,572,824 B2 * | 2/2020 | Chamberlain | .......... G06F 21/85 |

OTHER PUBLICATIONS

Arora, Aman et al., "Hamamu: Specializing FPGAs For ML Applications By Adding Hard Matrix Multiplier Blocks," 31st International Conference on Application-Specific Systems, Architectures and Processors, 8 pages, Jul. 6-8, 2020.
(Continued)

*Primary Examiner* — Tsu-Chang Lee

(57) ABSTRACT

Systems and methods for a new field programmable gate array (FPGA) architecture that is optimized for machine learning (ML) applications are provided. Such ML applications can specifically include, for example, artificial neural networks and deep neural networks. Various embodiments enable the design of faster and more power efficient hardware accelerators for machine learning algorithms, compared to existing FPGAs in the market. This is made possible by hard systolic matrix multiplier blocks, hard activation blocks and soft ML-centric configurable logic blocks. The matrix multiplier blocks are connected to field programmable interconnect resources to enable creation of larger matrix multipliers. The hard matrix multipliers and the hard activation blocks have programmable interconnects between them and neighboring memory or compute blocks on the device.

14 Claims, 22 Drawing Sheets

(51) Int. Cl.
  *H03K 19/17704* (2020.01)
  *H03K 19/17728* (2020.01)
(58) Field of Classification Search
  USPC ........................................................... 706/12
  See application file for complete search history.

(56)                    References Cited

OTHER PUBLICATIONS

International Application No. PCT/US2020/053209, International
Search Report, Written Opinion, 11 pages, Feb. 17, 2021.

\* cited by examiner

Legend

| | |
|---|---|
| A | Regular FPGA CLBs |
| B | Specialized CLBs |
| C | Memory blocks |
| D | Hard activation blocks |
| E | Hard matrix multiplier blocks |
| F | Flash memory |
| — | Regular FPGA interconnect |
| ■ | Regular FPGA switches |

LEGEND

MEMORY BLOCKS

HARD MATRIX MULTIPLIER BLOCKS

DIRECT INTERCONNECT TO MEMORIES

DIRECT INTERCONNECT TO MATRIX MULTIPLIERS

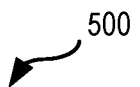
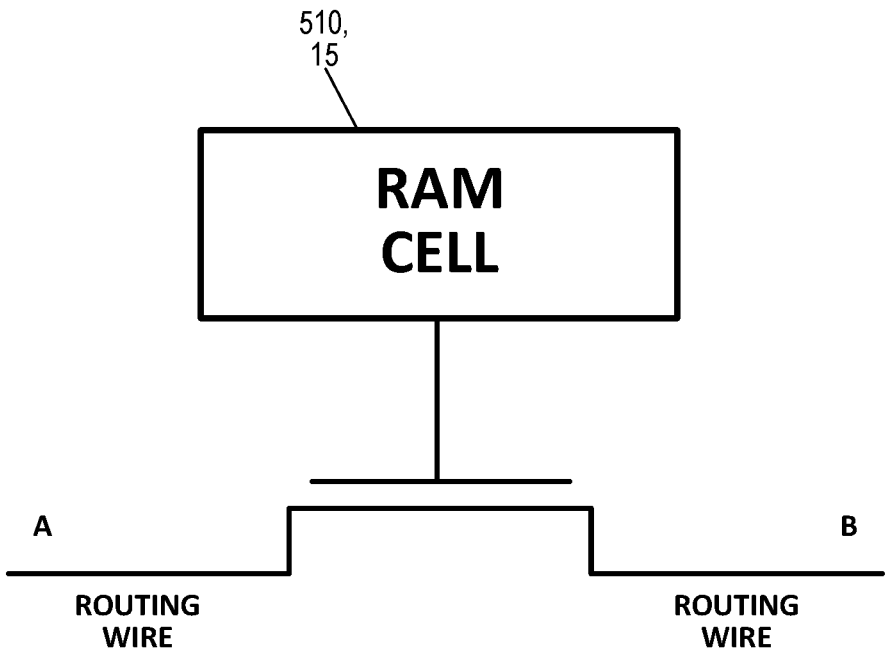
FIG. 5

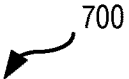

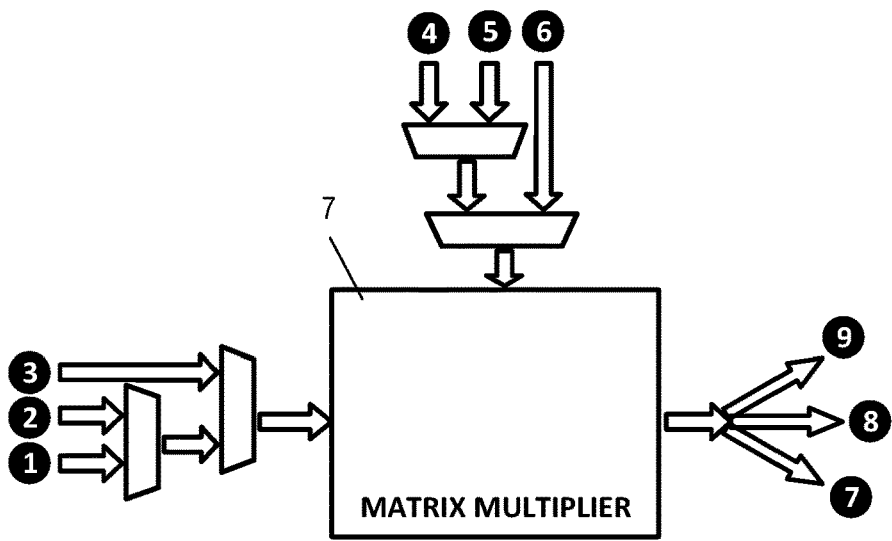

1 FROM REGULAR PROGRAMMABLE INTERCONNECT

2 FROM NEARBY MEMORY ON THE LEFT, FOR INPUT MATRIX A ("DIRECT" INTERCONNECT)

3 FROM MATRIX MULTIPLIER ON THE LEFT, FOR SYSTOLIC COMPOSITION ("DIRECT SPECIAL" INTERCONNECT)

4 FROM REGULAR PROGRAMMABLE INTERCONNECT

5 FROM NEARBY MEMORY ABOVE, FOR INPUT MATRIX B ("DIRECT" INTERCONNECT)

6 FROM MATRIX MULTIPLIER ABOVE, FOR SYSTOLIC COMPOSITION ("DIRECT SPECIAL" INTERCONNECT)

7 TO REGULAR PROGRAMMABLE INTERCONNECT

8 TO NEARBY MEMORY ("DIRECT" INTERCONNECT)

9 TO NEARBY MATRIX MULITIPLIER ("DIRECT SPECIAL" INTERCONNECT)

FIG. 7

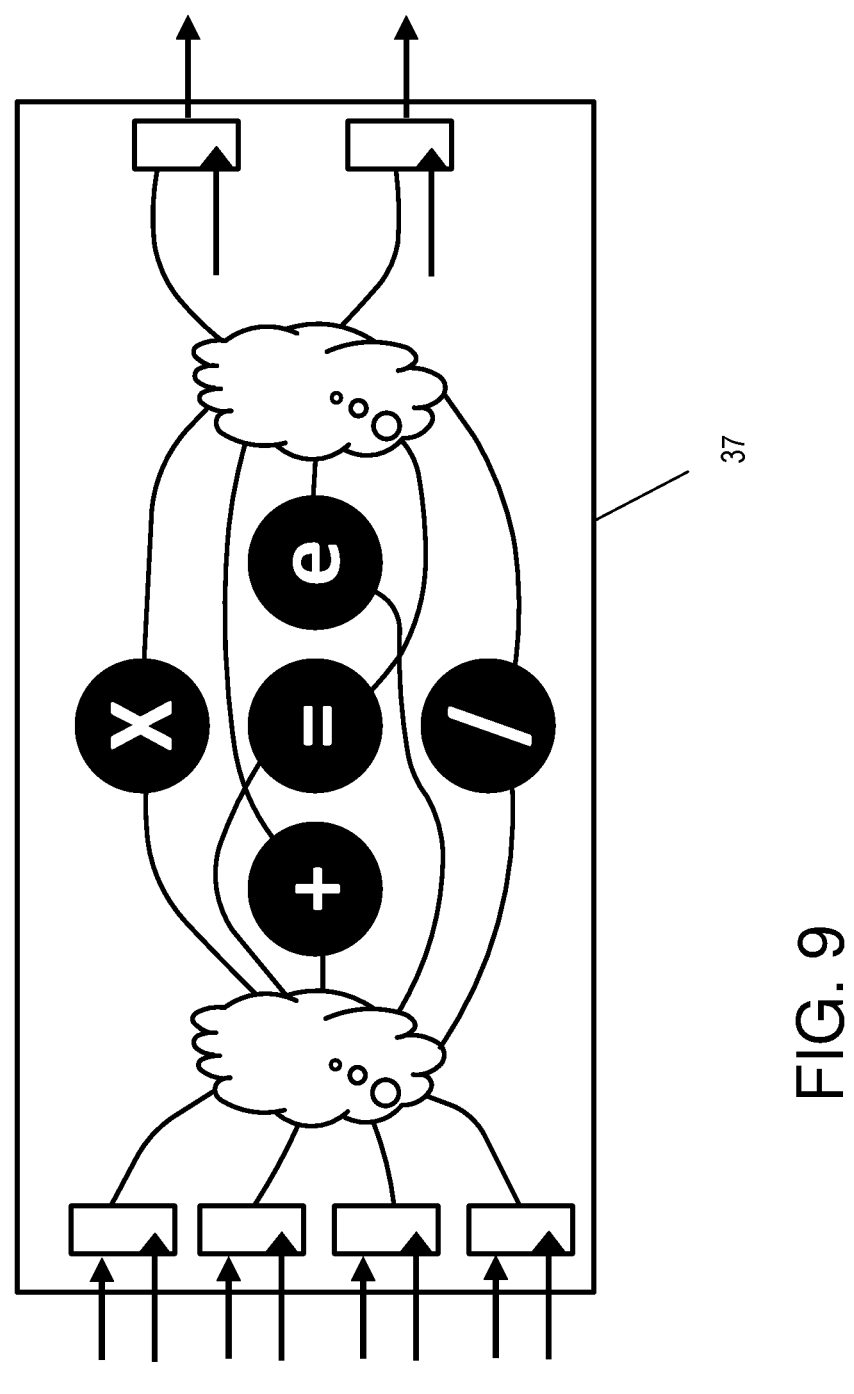
37
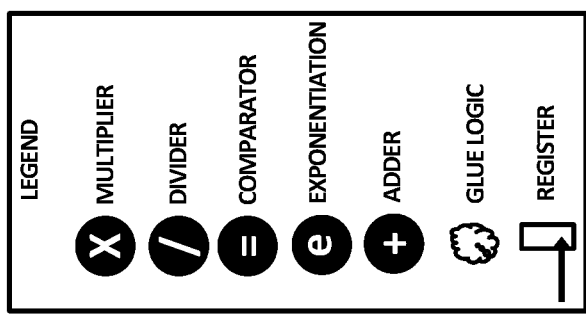
FIG. 9

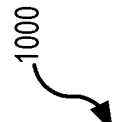
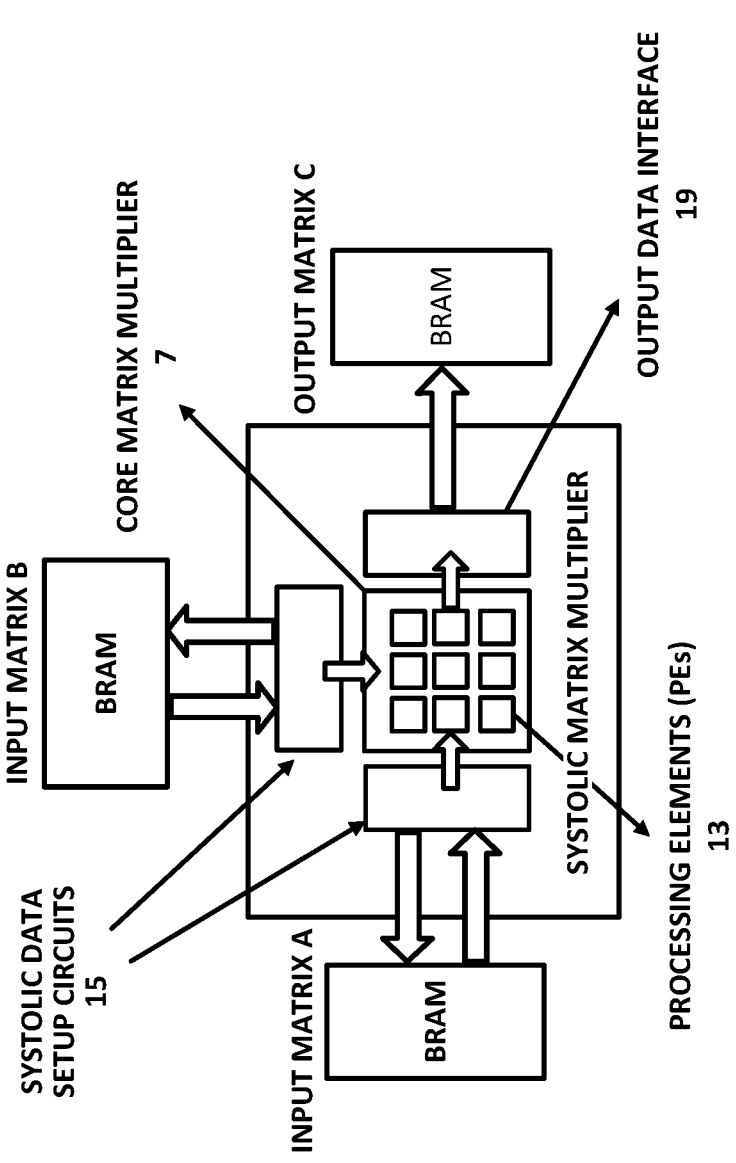
FIG. 10

A00, A01, A10, A11 ARE SUB-MATRICES OF MATRIX A

B00, B01, B10, B11 ARE SUB-MATRICES OF MATRIX B

C00, C01, C10, C11 ARE SUB-MATRICES OF MATRIX C

C00 = A00 x B00 + A01 x B10

C01 = A00 x B01 + A01 x B11

C10 = A10 x B00 + A11 x B10

C11 = A10 x B01 + A11 x B11

1402

27          7          37

1406

37          27    7

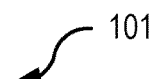

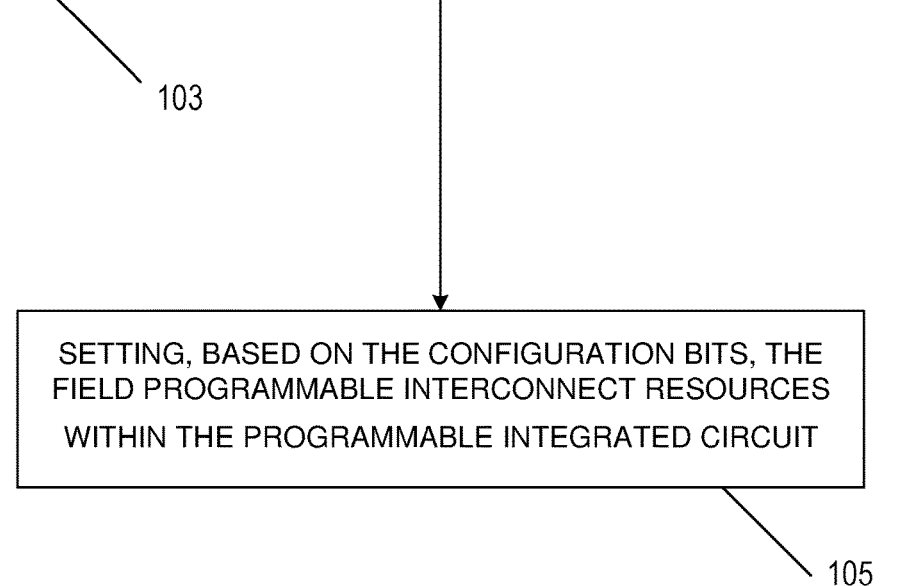

RECEIVING CONFIGURATION BITS AT A CONFIGURATION MEMORY INSIDE OF A PROGRAMMABLE INTEGRATED CIRCUIT HAVING FIELD PROGRAMMABLE INTERCONNECT RESOURCES AND A SET OF MULTIPLE HARD MATRIX MULTIPLIERS WITH PROGRAMMABLE INTERCONNECTS BETWEEN THE HARD MATRIX MULTIPLIERS AND THE FIELD PROGRAMMABLE INTERCONNECT RESOURCES NEIGHBORING THE SET OF HARD MATRIX MULTIPLIERS

103

SETTING, BASED ON THE CONFIGURATION BITS, THE FIELD PROGRAMMABLE INTERCONNECT RESOURCES WITHIN THE PROGRAMMABLE INTEGRATED CIRCUIT

FIELD PROGRAMMABLE GATE ARRAY ARCHITECTURE OPTIMIZED FOR MACHINE LEARNING APPLICATIONS

CROSS-REFERENCE TO RELATED APPLICATIONS

This application is a national stage of International Application No. PCT/US2020/053209 filed on Sep. 29, 2020; which claims priority to U.S. Provisional Patent Application No. 62/908,127 filed on Sep. 30, 2019; the entire contents of each of which are incorporate herein by reference.

TECHNICAL FIELD

Various embodiments of the present technology generally relate to field programmable gate arrays (FPGAs). More specifically, some embodiments of the present technology relate to FPGA architectures optimized for machine learning applications.

BACKGROUND

Artificial Intelligence (AI) has been called the new electricity. The availability of huge amounts of data and of massively parallel computing machines have made it possible for algorithms from the last century (like Artificial Neural Networks (ANNs)) to become viable, kicking off an AI and ML (Machine Learning) revolution. But the size of data available is growing at an enormous pace and the number of applications deploying AI/ML is on the rise. As such, there is a need to design better hardware that can accelerate the computations required to keep up with the pace of growing AI/ML applications and data.

Lots of solutions have been proposed and/or deployed for accelerating ANNs in hardware, ranging from ASICs to fully programmable GPUs to configurable FPGA based solutions. ASIC based designs have the best speed and power characteristics (fast and low power), but they lack configurability and adaptability which is very important in the rapidly changing world of AI/ML. Graphics processing unit (GPU) and central processing unit (CPU) based designs, while highly programmable and adaptable, are not as fast and power-efficient. Field programmable gate array (FPGA) based designs provide the best of both worlds. They are flexible and easily configurable, and also fast and power-efficient. FPGA based solutions for machine learning are being deployed in the cloud and on the edge. However, there is still a need for improved designs that allow for power-efficient acceleration of computations.

SUMMARY

Various embodiments of the present technology generally relate to field programmable gate arrays (FPGAs). More specifically, some embodiments of the present technology relate to FPGA architectures that are optimized for machine learning applications. In the current era of deep learning, designing hardware for accelerating artificial neural networks (ANNs) has become a major challenge. Rapidly changing algorithms and network architectures in this field make the cost and effort of designing Application Specific Integrated Circuits (ASICs) for such applications an unattractive solution, despite their energy efficiency. Many Field Programmable Gate Array (FPGA) based designs have been proposed and deployed, but the generic building blocks available in current FPGAs limit the acceleration that can be achieved. In contrast, various embodiments of the present technology provide for an FPGA specialized for these applications.

Specifically, some embodiments add hard matrix multiplier blocks into the FPGA fabric. These hard matrix multiplier blocks can be implemented using systolic arrays of MACs (Multiply-And-Accumulate), and can be connected using programmable direct interconnect to make larger matrix multipliers. Various sizes and various placements of hard matrix multipliers have been explored. Experimental results from some embodiments of the present technology show that adding a 4×4×4 hard matrix multiplier block to an FPGA's fabric speeds up state-of-the-art neural networks by 2.5×, on average. Silicon area improvement of 8× and clock frequency improvement of 3× is seen when designing a 64×64×64 matrix multiplier on an FPGA with hard 4×4×4 hard matrix multiplier blocks versus an FPGA with DSP slices. Therefore, some embodiments of the FPGAs with hard matrix multipliers enable the design of faster, more area (and hence, power) efficient hardware accelerators for ANN applications, compared to current FPGAs, at the cost of reducing the flexibility of the FPGA for other applications.

Some embodiments of the programmable integrated circuit include multiple field programmable interconnect resources (e.g., memory blocks, logic blocks, etc.) and a set of multiple hard matrix multipliers with programmable direct interconnects between combinations of the hard matrix multipliers. There may also be programmable direct interconnects between the hard matrix multipliers and field programmable interconnect resources (e.g., memory) neighboring the set of hard matrix multipliers.

In some embodiments, at least one of the hard matrix multipliers can include a systolic array based implementation of processing elements to compute an output matrix. A systolic data setup circuit may also be included in some embodiments of the hard matrix multiplier to prepare and provide the data from: adjacent matrix multiplier blocks, or other field programmable interconnect resources, or external input pins to the processing elements. An output data interface circuit may also be present to write the data to an output of the hard matrix multiplier. In some embodiments, the hard (systolic) matrix multiplier blocks include programmable direct interconnects to combine small systolic matrix multipliers to form larger systolic matrix multipliers.

The field programmable interconnect resources can include at least one memory block that has stored thereon matrices to be used as inputs to the set of multiple hard matrix multipliers. The field programmable interconnect resources may also include generic logic blocks that can be used to implement any logic. Some embodiments of the programmable integrated circuit can also include machine learning-centric (ML-centric) configurable logic blocks (CLBs) that contain at least one divider or at least one exponential calculator. The programmable integrated circuit used in some embodiments can also include soft generic LUT-based configurable logic blocks that can be used to implement any logic.

In some embodiments, a programmable circuit for implementing machine learning algorithms, the programmable can include, field programmable interconnect resources and at least one systolic matrix multiplier. The systolic matrix multiplier can include multiple smaller systolic matrix multipliers. The systolic matrix multiplier can be connected to the field programmable interconnect resources and each of the smaller systolic matrix multipliers can have a control unit and programmable direct interconnect points, or circuitry, allowing the smaller systolic matrix multipliers to access the field programmable interconnect resources. Each of the smaller systolic matrix multipliers can also be connected to adjacent smaller systolic matrix multipliers using programmable direct interconnect resources and each of the smaller systolic matrix multipliers can function independently by themselves or as a part of larger systolic matrix multiplier(s). In some embodiments each of the smaller systolic matrix multipliers can have a control unit each control unit from the smaller systolic matrix multipliers can be interconnected to create larger control unit for the systolic multiplier.

A programmable circuit for machine learning optimization can include memory blocks and hard activation blocks. The hard activation block can be communicably coupled to the memory blocks using programmable direct interconnects. The hard activation blocks can be configured to receive inputs from a first connected memory block and store an output to a second connected memory block. The hard activation blocks can be connected, using programmable direct interconnects, to a group of multiple matrix multiplier blocks that are each configured to multiply a matrix of a first size with another matrix of a compatible size to generate a product matrix. Each of the multiple matrix multiplier blocks can be interconnected to neighboring matrix multiplier blocks (e.g., via programmable direct interconnects) to allow multiplication of matrices having a size larger than the first size. The output can then be fed to a first processing block and the input is coming from a second processing block.

In some embodiments, the programmable circuit can be configured to perform ML operations (e.g., relu, softmax, sigmoid, tanh, adding two matrices or vectors, multiplying all elements of a matrix or vector with a constant, averaging all elements of a matrix or vector, or the like. In some embodiments, the configurable logic blocks can include one adder, one multiplier, one divider, one exponential calculator, and/or one comparator. The matrix multiplier blocks can be configured to receive inputs from field programmable interconnects, memory blocks, logic blocks, and/or neighboring multiplier blocks using programmable direct interconnects. In some embodiments, the multiple matrix multiplier blocks can be configured to send output to programmable interconnects, memory blocks, and neighboring matrix multiplier blocks using programmable direct interconnects. The data stored in the memory blocks may be of type various types (e.g., integer or type floating point) depending on the needs of the application.

A method for configuring a programmable integrated circuit that includes receiving configuration bits at a configuration memory inside of a programmable integrated circuit. The programmable integrated circuit can have field programmable interconnect resources and a set of multiple hard matrix multipliers with programmable direct interconnects between the hard matrix multipliers and field programmable interconnect resources neighboring the set of hard matrix multipliers. The configuration bits can indicate how to connect or disconnect one resource with another resource within the programmable circuit. Based on the configuration bits, the resources can be set within the programmable integrated circuit.

In some embodiments, a computing device can include a processor, a memory, and a programmable integrated circuit. The memory can have stored thereon instructions and data for a machine learning application. The programmable integrated circuit can be communicably coupled to the memory and processor to perform various tasks from a machine learning application. In some embodiments, the programmable integrated circuit can include input and output pins, a configuration memory, a field programmable interconnect resource, and a set of multiple hard matrix multipliers. The configuration memory can be configured to receive a set of configuration bits via the input and output pins. The configuration bits can provide an indication (or instructions) of which resources to connect or disconnect within the programmable circuits. The set of multiple hard matrix multipliers may be configured within the programmable integrated circuit so that the programmable direct interconnects are logically and/or physically between the hard matrix multipliers and field programmable interconnect resources neighboring the set of hard matrix multipliers.

While multiple embodiments are disclosed, still other embodiments of the present technology will become apparent to those skilled in the art from the following detailed description, which shows and describes illustrative embodiments of the technology. As will be realized, the technology is capable of modifications in various aspects, all without departing from the scope of the present technology. Accordingly, the drawings and detailed description are to be regarded as illustrative in nature and not restrictive.

BRIEF DESCRIPTION OF THE DRAWINGS

Embodiments of the present technology will be described and explained through the use of the accompanying drawings.

FIG. 5 is a diagram illustrating an example of a pass transistor based on/off control for a programmable interconnect circuit that may be used in some embodiments of the present technology.

FIG. 7 is a logical depiction of an example of the connectivity of a hard matrix multiplier block that may be used in some embodiments of the present technology.

FIG. 9 is an example of a high level block diagram of the specialized ML-centric configurable logic block (CLB) in accordance with various embodiments of the present technology.

FIG. 10 is an example of control circuitry for data setting up of a hard matrix multiplier block that may be used in some embodiments of the present technology.

FIG. 19 is flow chart of a method for configuring a programmable integrated circuit that may be used in some embodiments of the present technology.

Figure 1:
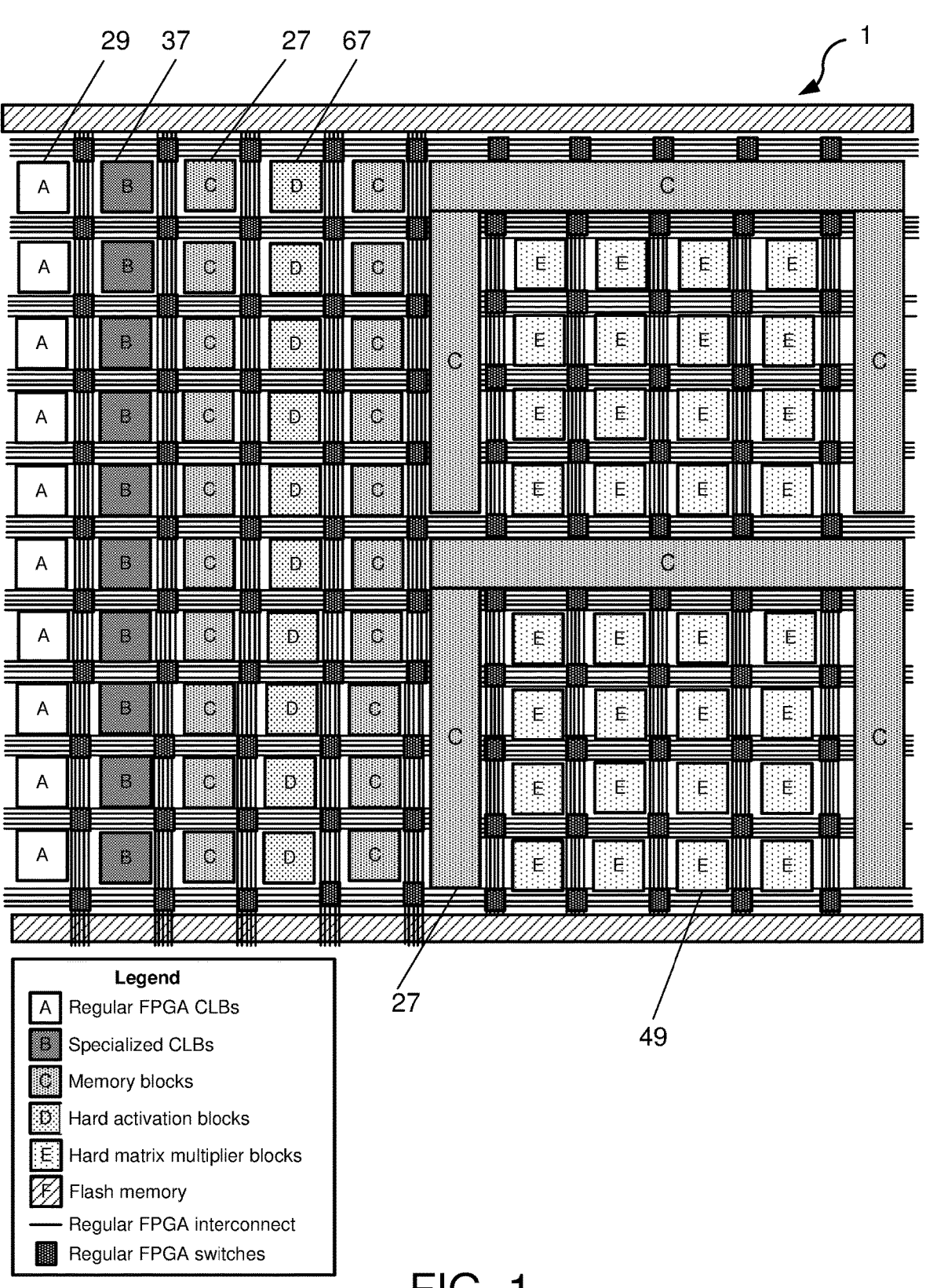
FIG. 1 illustrates an example of a high level layout of the FPGA showing various special purpose and general-purpose blocks in accordance with various embodiments of the present technology.

The drawings have not necessarily been drawn to scale. Similarly, some components and/or operations may be separated into different blocks or combined into a single block for the purposes of discussion of some of the embodiments of the present technology. Moreover, while the technology is amenable to various modifications and alternative forms, specific embodiments have been shown by way of example in the drawings and are described in detail below. The intention, however, is not to limit the technology to the particular embodiments described. On the contrary, the technology is intended to cover all modifications, equivalents, and alternatives falling within the scope of the technology as defined by the appended claims.

DETAILED DESCRIPTION

Various embodiments of the present technology generally to programmable (reconfigurable) integrated circuits 1 and techniques of dynamically reconfiguring programmable (reconfigurable) integrated circuits 1 to different configurations and organizations. Machine learning algorithms, specifically artificial neural networks (ANNs) and deep neural networks (DNNs), have become commonplace in the recent years. These algorithms are very computationally intensive and therefore, there is a tendency to accelerate them using hardware, instead of running them as software. The hardware being used to run machine learning algorithms ranges from general purpose processors (like CPUs), to highly parallel processors (like GPUs), to dedicated accelerator ASICs, to FPGA based implementations. Each of these choices has a different performance profile, in terms of speed and power consumption.

The FPGA based implementations use the FPGAs available in the market that have the general-purpose programmable blocks. Unfortunately, these blocks not well suited for accelerating machine learning algorithms. For example, multiplication of very large matrices is at the core of any machine learning algorithm. But implementing a matrix multiplier using the blocks present on current FPGAs yields a low performance matrix multiplier. Even if multipliers in the DSP blocks can be used, implementations of machine learning algorithms on current FPGAs are slow and consume a lot of power.

Traditional FPGAs mainly comprise of what is known as programmable logic-building blocks that can be programmed/configured to design circuits that can perform almost all common digital operations. The building blocks in current FPGAs are LUT-based logic blocks (commonly called CLBs), memory blocks (commonly called BRAMs) and DSP (Digital Signal Processing) slices. CLBs can be used to design any logic function by essentially storing their truth tables and are generally referred to as "soft" logic. The DSP slices contain arithmetic and logic units such as multipliers, adders, ALUs, shifters, and the like.

These blocks perform dedicated, yet common, operations that could also be implemented in soft logic, and are referred to as "hard" logic. The fact that these building blocks are very generic make FPGAs a great solution to design any kind of hardware. Adaptable/configurable logic blocks generally contain Look Up Tables (LUTs) and flip-flops and can be used to implement any digital logic circuit. Digital signal processing (DSP) slices often contain hard multipliers, accumulators and adders, and are useful for implementing math-intensive circuits. There are lot of RAMs to store data going into and coming out of the two types of blocks mentioned above. These are usually dual-port RAMs. However, there are many blocks of memories which can be organized in various widths.

Among all the operations executed by different types of state-of-the-art neural networks, about 90% of the operations are matrix multiplications (also called GEMM—General Matrix Multiply). Designing a matrix multiplier using the common building blocks available on current FPGAs (CLBs and DSP slices) leads to an implementation which is slow and not area (hence, power) efficient.

In contrast, various embodiments of the present technology provide resources specialized for machine learning. Some embodiments of the programmable integrated circuit (e.g., FPGA) 1 architecture enable designing faster and more power efficient machine learning accelerators, while still maintaining the versatility and flexibility that comes with FPGAs, compared to ASICs. Some embodiments add hard matrix multiplier blocks 7 to the FPGA 1 to provide for fast computations which are energy efficient. As such, various embodiments of the FPGA 1 architecture lead to faster and power-efficient designs for ML/ANN applications, while keeping the programmability and adaptability benefits over ASIC based designs, and also the speed and power benefits over GPU/CPU based designs. This will make some embodiments of the FPGA 1 slightly less flexible, but the gains to be had are large enough to justify adding them, especially with the abundance of AI/ML use cases.

Various embodiments of the present technology provide for a wide range of technical effects, advantages, and/or improvements to computing systems and components. For example, various embodiments include one or more of the following technical effects, advantages, and/or improvements: 1) a fundamental change in the architecture of FPGAs; 2) integration of hard matrix multiplier blocks 7 to the programmable logic part of the FPGA 1; 3) improvement in the performance of FPGAs; 4) addition of "neural resources" to FPGAs to accelerate repeated machine learning computations; 5) achievement of ASIC-like performance and energy benefits; 5) optimizing the speed and power consumption of routine machine learning operations resulting in FPGA based designs that have higher performance and area efficiency; 6) changing the manner in which a computing system reacts to machine learning applications; 7) provides insight into the size/dimensions of these hard matrix multiplier blocks 7; 8) efficiently utilizes programmable (e.g., direct) interconnects 9 between hard matrix multiplier blocks 7; 9) addition of programmable direct interconnect between neighboring matrix multiplier blocks 49, so that larger matrix multiplications can be done systolically; 10) a distributed layout in which these matrix multiplication blocks 49 are distributed evenly across the FPGA 1 fabric; 11) changes to the FPGA architecture to increase the viability of using FPGAs as neural network accelerators; 12) use of FPGAs with hard matrix multiplier blocks 7 to better emulate ASIC designs for AI/ML applications, because all those designs have matrix multiplication engines; and/or 13) provides insight into the placement of the hard matrix multipliers 7 on the FPGA 1.

In the following description, for the purposes of explanation, numerous specific details are set forth in order to provide a thorough understanding of embodiments of the present technology. It will be apparent, however, to one skilled in the art that embodiments of the present technology may be practiced without some of these specific details.

The techniques introduced here can be embodied as special-purpose hardware (e.g., circuitry), as programmable circuitry appropriately programmed with software and/or firmware, or as a combination of special-purpose and programmable circuitry. Hence, embodiments may include a machine-readable medium having stored thereon instructions which may be used to program a computer (or other electronic devices) to perform a process. The machine-readable medium may include, but is not limited to, floppy diskettes, optical disks, compact disc read-only memories (CD-ROMs), magneto-optical disks, ROMs, random access memories (RAMs), erasable programmable read-only memories (EPROMs), electrically erasable programmable read-only memories (EEPROMs), magnetic or optical cards, flash memory, or other type of media/machine-readable medium suitable for storing electronic instructions.

The phrases "in some embodiments," "according to some embodiments," "in the embodiments shown," "in other embodiments," and the like generally mean the particular feature, structure, or characteristic following the phrase is included in at least one implementation of the present technology, and may be included in more than one implementation. In addition, such phrases do not necessarily refer to the same embodiments or different embodiments.

The terms "artificial intelligence" (or AI), "machine learning" (or ML) and "deep learning" or (DL) are used synonymously and interchangeably, although there are subtle differences in their actual definitions.

The term "neural networks" or NNs is used to refer to artificial neural networks or deep neural networks, which are commonly deployed for AI/ML/DL.

"Building block(s)" is used for the components that make up an FPGA 1-CLBs 27, DSP slices, or blocks, BRAMs, and now, hard matrix multipliers 7.

Hard matrix multiplier building blocks 7 are called "matmul(s)" or "matmul block(s)" to make the text concise.

"Building block size" or "matmul size" refers to the dimensions of the hard matrix multiplier 7 used.

"Design" refers to the Verilog design that is overlayed or implemented onto an FPGA 1.

"Design size" or "problem size" refers to the dimensions of the matrix multiplier 49 being overlayed on the FPGA 1.

A M×N×K matrix multiplier 49 multiplies a M×K matrix (matrix with a K×N matrix (matrix B) to produce a M×N matrix (matrix D). A problem size of M×N×K means that we want to multiply a M×K matrix with a K×N matrix to obtain a M×N matrix as a result.

"Critical path" refers to the largest flop-to-flop delay (clock-to-Q+combinatorial logic delay) in the design. It doesn't refer to the longest path from input to output of a block/design.

MWTA refers to Minimum Width Transistor Area. This is a technology-independent unit of area consumed by a circuit.

Specialized Blocks

FIG. 1 illustrates an example of a high level layout of the FPGA 1 showing various special-purpose and general-purpose blocks in accordance with various embodiments of the present technology. As illustrated in FIG. 1, some embodiments of the FPGA 1 architecture include the following blocks to an FPGA: Matrix multiplier blocks 49 (also marked as "E" in FIG. 1); activation blocks 67 (also marked as "D" in FIG. 1); and specialized ML-centric configurable logic blocks (CLBs) 37 (also marked as "B" in FIG. 1). The architecture of FPGA 1 also contains many adaptable/configurable logic blocks 29 (also marked as "A" in FIG. 1) and memory blocks 27 (also marked as "C" in FIG. 1). Memory blocks 27 can include embedded RAMs having programmable width and depth. These blocks make FPGA 1 versatile. In addition, any logic required for an ANN/DNN that cannot be designed using specialized blocks B, D, E, can be implemented using the generic logic blocks 29 (also marked as "A").

The word "hard" in the phrase hard matrix multiplier blocks 7 is used to contrast LUT-based configurable/programmable blocks that can be used to implement any logic, which are generally called "soft" blocks. A hard block 7 has better performance than a soft block, at the cost of loss of flexibility/generality. In accordance with various embodiments, the matrix multiplier block 49 multiplies a matrix A of a certain size (e.g., a 32×32 matrix) with another matrix B of matching size (e.g., a 32×32 matrix) to generate a product matrix C (e.g., a 32×32). Note that the size of the matrix multiplier is not particularly relevant and can vary in different embodiments. The coarseness/granularity of some embodiments of the matrix multiplier 49 can range from smaller sizes like 4×4/4×4 matrix multipliers 49 to large sizes like 256×256/256×256 matrix multipliers 49.

Figure 2A:
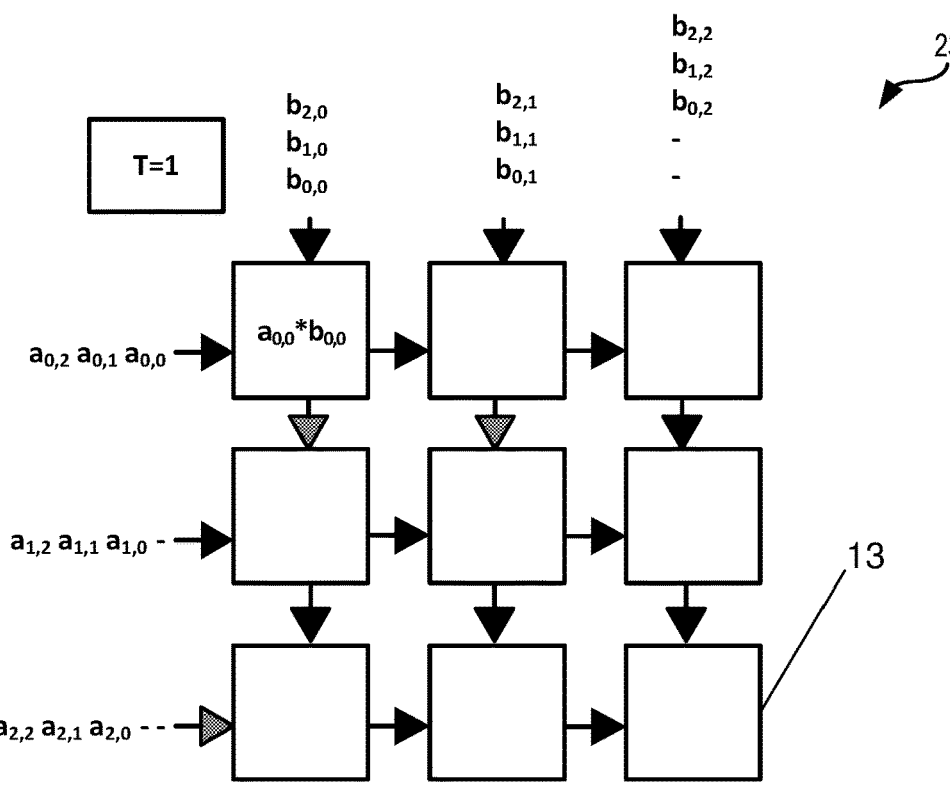
FIGS. 2A-2B illustrate an example of a 3×3 systolic matrix multiplier (shown at time T=1 and T=3) in accordance with various embodiments of the present technology.
Figure 2B:
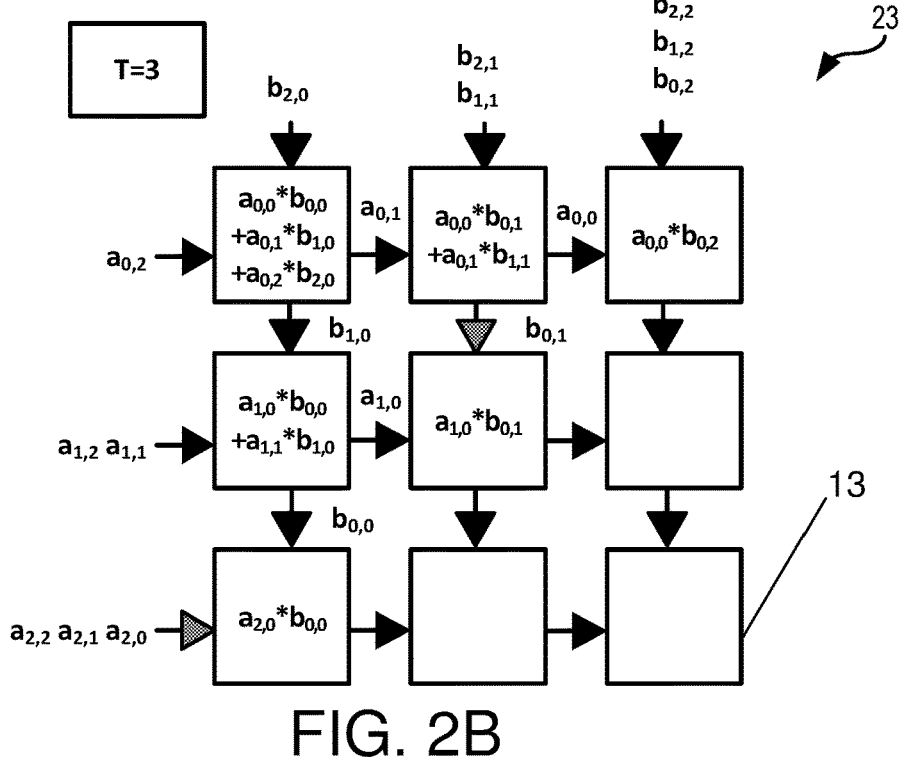

In some embodiments, the block 49 can use a systolic array 23 based implementation to compute the output matrix. As such, to multiply two N*N matrices, there are $N^3$ multiplications that need to be performed. It is possible to use $N^2$ processing elements (PEs) 13 enabling completion of the matrix multiplication in N steps. For example, consider the fabric with nine PEs 13 as shown in FIGS. 2A-2B. In order to multiply the two 3×3 matrices, the matrix elements can be staged as shown in these figures. FIG. 2A indicates the condition at time 1. In the first cycle, a0,0 and b0,0 propagate into the top left PE and get multiplied. In the next cycle, a0,0 moves to the right and b0,0 moves to the bottom direction. Two more PEs are involved in cycle 2. FIG. 2B indicates the location of the operands in the 3rd cycle. In the 7th cycle, all multiplications and additions are completed, and each of the answers are residing in the N PEs. In general, multiplication of n*n matrices can be achieved in O(n) steps.

The hard matrix multiplier 7 will include all control units 45 required to perform the multiplication of the provided size (e.g., 3×3 or 8×8 or 16×16 or the like). A control circuitry, called systolic data setup circuit 15, can be used to prepare and provide the data at the right time. A control circuit, called the output data interface circuit 16, can be used to write the data to the output.

Generally, the sizes of the matrices to be multiplied in DNNs are very large. It is possible to provide large matrix multipliers 49 in the FPGA 1, but when the hard matrix multiplier's 7 size is large, there can be under-utilization of the resource in case small matrices need to be multiplied. When the hard matrix multiplier's 7 size is small, the utilization can be high but then, if a larger matrix multiplier 49 is needed, the implementation becomes inefficient. Combining smaller systolic matrix multipliers to create larger matrix multipliers 23 using the regular FPGA programmable interconnect does not yield efficient large multipliers.

The systolic matrix multiplier blocks used in various embodiments can incorporate programmable direct interconnects to combine small systolic matrix multipliers 23 to form larger systolic matrix multipliers 25. In some embodiments, there are programmable (e.g., direct) connections 9 from the one matrix multiplier block 49 to the matrix multiplier 49 on the right and to the matrix multiplier 49 below. This lets intermediate accumulated values (partial sums) to flow from one block to the others. The first matrix multiplier block 49 in combination with the block 49 to the right, the block 49 below it and the block 49 diagonally to its bottom-right now act as a bigger systolic matrix multiplier 25. These programmable direct connections 9, also referred to herein as programmable interconnects 9, between various matrix multiplication blocks 49 are separate from the general FPGA programmable interconnect.

The size of the next larger matrix multiplier 49 possible depends on the granularity/coarseness of the smallest matrix multiplier 49 available. For example, if the small matrix multiplier 49 provided is 4×4, it is possible to create 8×8, 12×12, 16×16, 32×32, 64×64, 128×128 etc. As another example, if the size of one matrix multiplier block 49 to be 32×32, a 64×64 multiplier, a 96×96 multiplier, a 128×128 multiplier, and so on could be constructed. The largest size matrix multiplier 25 that could be composed depends on the total number of small sized matrix multipliers 49 (or, as multiple smaller systolic matrix multipliers 23) available in the chip.

Figure 3:
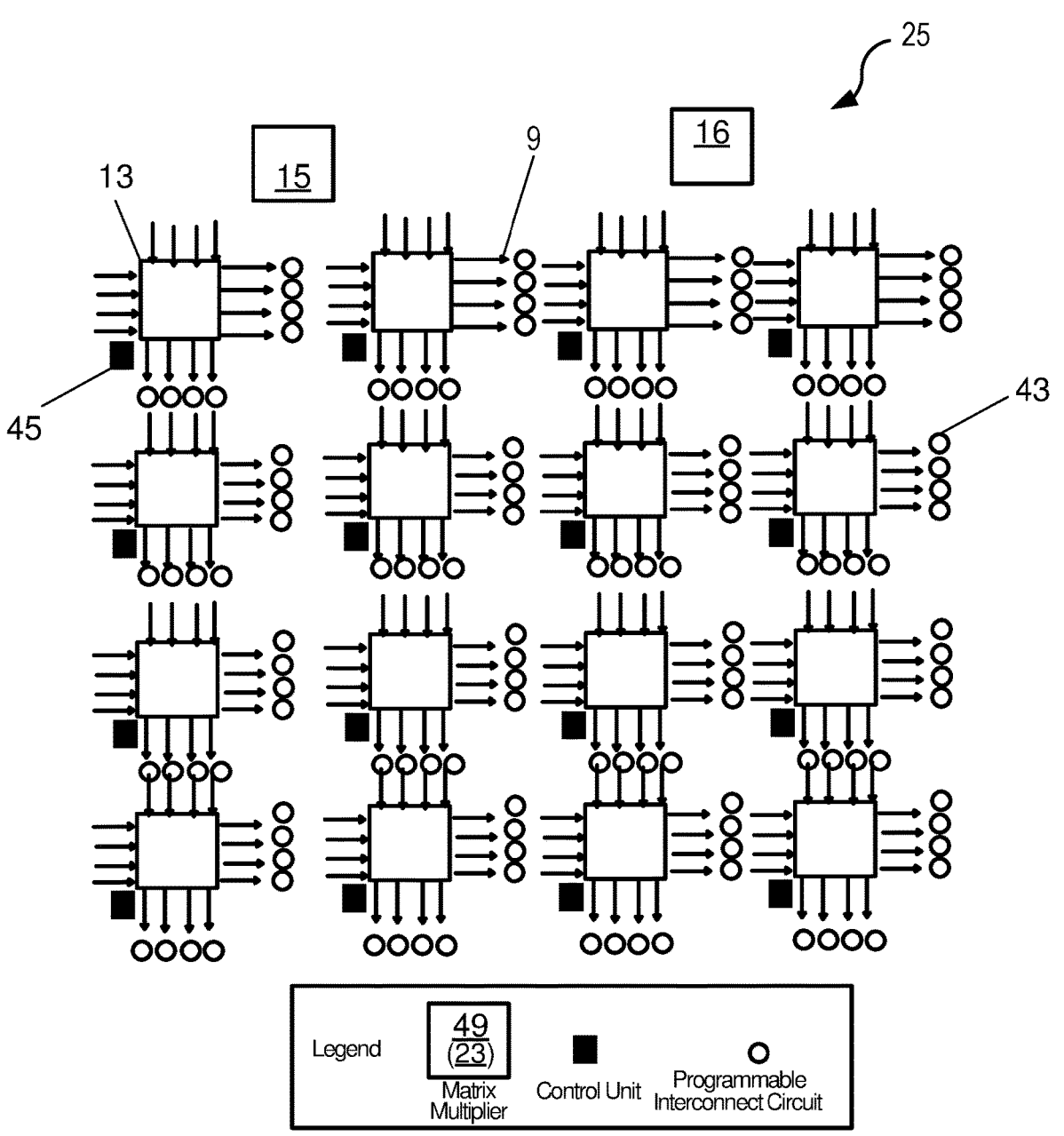
FIG. 3 illustrates an example of a 16×16 systolic matrix multiplier composed of sixteen 4×4 systolic matrix multipliers in accordance with various embodiments of the present technology.

FIG. 3 shows the creation of a 16×16 matrix multiplier 25 from sixteen 4×4 matrix multipliers 25. The programmable interconnect circuits 43 are shown using circles for each of their respective programmable interconnects 9. To be able to compose large multiplier arrays 25 from smaller multiplier arrays 23 (or multipliers 49), the systolic data setup circuit 15 allows for reading inputs from the matrix multiplier block 49 (or array 23) on the left or the top (instead of reading inputs from a memory block as in traditional FPGAs). In other words, when a multiplier block 49 (or array 23) is a part of a larger multiplier 25, this logic helps receive its inputs from a neighboring matrix multiplier block 49 (or array 23).

Figure 4:
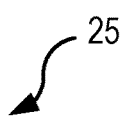
FIG. 4 illustrates an example of a high level block diagram of a matrix multiplier array block showing the programmable direct connection to neighboring memories and to adjacent matrix multiplier blocks (with the general programmable interconnect is removed for clarity) to compose larger matrix multipliers in accordance with various embodiments of the present technology.

FIG. 4 shows a matrix multiplier array block 25 containing sixteen hard multiplier blocks 7. The outlined white arrows show the direct connectivity to other multipliers. The solid black arrows show the direct connectivity to memory blocks 27. The direct interconnects are explained in more detail below. While the term matrix is used by many to denote two-dimensional arrays, the term matrix is used in the most general sense of the term and can include vectors which have a dimension of 1, or tensors with higher dimensions than 2.

Programmable (e.g., Direct) Interconnections

Figure 6:
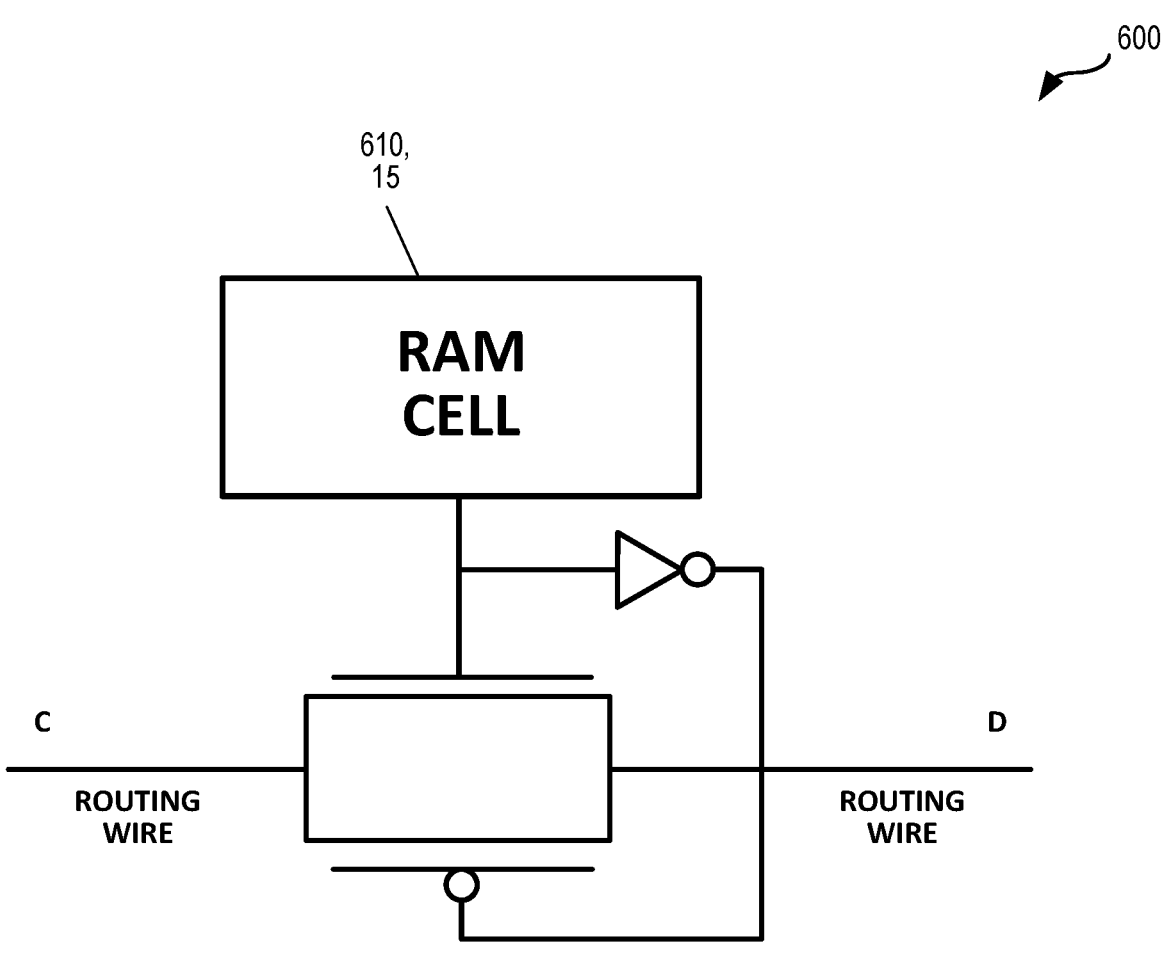
FIG. 6 is a diagram illustrating an example of pass gate based programmable interconnect that may be used in some embodiments of the present technology.

Various embodiments of the FPGA 1 can have a lot of programmable interconnects 9. This takes many forms; for example, switches and channels. Some embodiments of the FPGA 1 architecture provide for some programmable interconnects 9, in addition to the general programmable interconnect. Programmable interconnect 9 can be provided where low latency (fast) data transfers are required. In accordance with various embodiments, to keep latency small, the number of programmable switches used (e.g., as part of control units 45), and the length of the wires should be small. For the closest programmable interconnect 9, there will only be one programmable transistor 500 in between as shown in FIG. 5. By writing a 0 or 1 into the RAM cell 510 in FIG. 5, wires A and B get connected. Typically, pass transistors as illustrated in FIG. 6 provide good connectivity and can be used in various embodiments. By writing 0 or 1 into the RAM cell 610 in FIG. 6, the wires C and D are connected or opened.

In order to provide the small wire lengths, the units that are being connected should be in proximity. Commercial FPGAs use such programmable direct interconnects between adjacent logic blocks. In contrast, some embodiments of the FPGAs 1 described herein use such programmable interconnects 9 between matrix multipliers 49 (or small systolic arrays 23 thereof). If such programmable direct interconnect is not available, the benefits provided by highly efficient computation blocks may be lost by going through general purpose switch matrices.

In accordance with various embodiments, the matrix multiplier block 49 can be connected using programmable interconnect 9 to its neighboring memory blocks 27. Two memory blocks 27 can store input matrices A and B that feed data into the matrix multiplier 25. The third memory block 27 at right in FIG. 4 can store the output matrix C and receive this data from the matrix multiplier 25 directly. The activation block 67 can be connected using programmable interconnect 9 to its neighboring two memory blocks 27. One of the directly connected memory blocks 27 stores the input matrix, making loading the inputs into the activation faster. Similarly, the block is connected directly to a second memory block 27 so that the output from the activation block 67 can be quickly stored.

FIG. 7 provides the logical details 700 of the connectivity of a hard matrix multiplier block 7. In the embodiments illustrated in FIG. 7, hard matrix multiplier block 7 can receive inputs from three sources—from regular programmable interconnect, from nearby memories, and from nearby multipliers using programmable direct interconnect. Hard matrix multiplier block 7 can send outputs to three places as well, as shown in FIG. 7.

The hard activation block 67 may also be connected using programmable direct interconnect to its neighboring memory blocks 27. The activation block 67 receives inputs from a directly connected memory 27 and stores output to a directly connected memory 27. Note that this does not add any additional ports to the RAMs on the device (likely dual port). The additional paths from these blocks to the memory are just created by using multiplexers. In addition, these programmable direct connections do not mean that these memories can only communicate with these blocks, or that these blocks can only communicated with these memories. These blocks and memories are still connected to the general programmable interconnect on the device. Therefore, these memories and these blocks can receive/send data to any other block on the device, although this communication will not be as efficient as communication over the programmable direct interconnect.

In order to configure the proposed chip, configuration bits can be sent into the configuration memory cells 15 which control the interconnections as in FIG. 5 and FIG. 6. Configuration memory cells 15 will also be associated with various programmable points, or circuitry (e.g. 43), in the chip 1, including but not limited to LUT based logic blocks, interconnections (e.g., 9) between various blocks, selection points (or circuitry) between activation functions, and special modules.

Hard Activation Block

Generating activations is the second most common operation in ANNs. The programmable integrated circuit 1 (e.g., FPGA 1) according to the present technology can add specifically designed activation blocks 67 to the FPGA 1. There are many activation functions used in ANNs these days, but these blocks implement the most common activation functions—ReLU, Sigmoid, and Tanh. In accordance with various embodiments, the activation block 67 can read a matrix A, apply the activation function to all its elements, and generate matrix B. Just like the matrix multiplier block, the activation block 67 can be connected directly to neighboring memories to read inputs from and write outputs to. The block can fetch operands from any other memory on the device using programmable interconnect as well.

Figure 8:
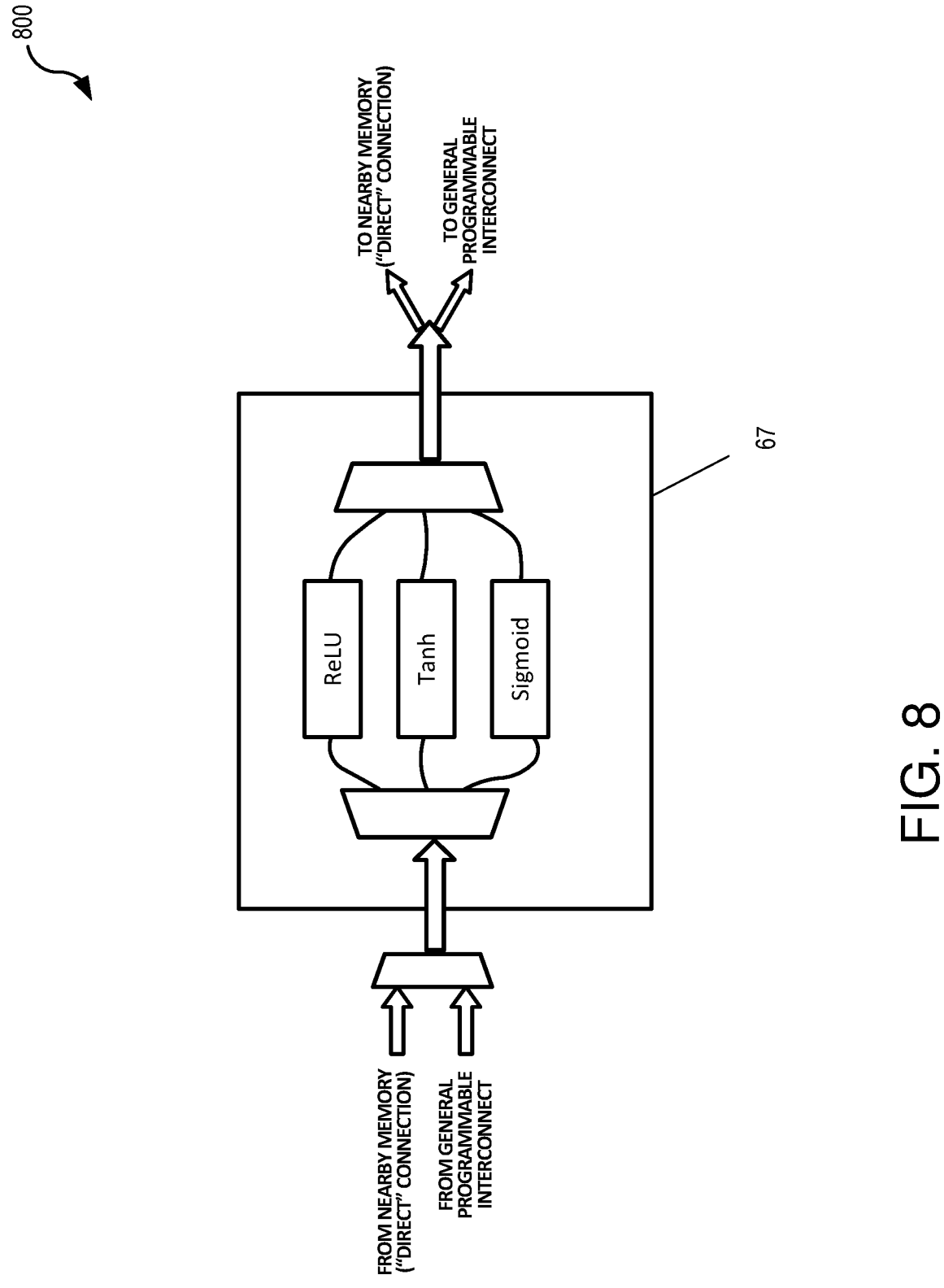
FIG. 8 is an example of a high level block diagram of the hard activation block, along with programmable direct connection to neighboring memories, in accordance with various embodiments of the present technology.

FIG. 8 shows a high-level internal block diagram 800 of the hard activation block 67 that may be used in some embodiments of the present technology. FIG. 8 also shows an example of the connectivity of the block 67 as well. In accordance with various embodiments, an activation function not provided by this block can be implemented using the specialized ML-centric CLBs 37 or generic adaptable/configurable logic blocks 29.

Specialized ML-Centric Configurable Logic Block

The generic adaptable/configurable logic block is a very flexible block and can be used to implement any digital circuit. But implementing computationally intensive functions (e.g., addition, multiplication, etc.) using these blocks doesn't generate optimal results. In ANNs, operations like adding two vectors together, multiplying all elements of a matrix with a constant, averaging all elements of a matrix, etc. are common. Therefore, the programmable integrated circuit 1 according to the present technology can add a CLB 37 to the FPGA 1 architecture that makes these operations performant.

FIG. 9 is an example of a high level block diagram 900 of the specialized ML-centric configurable logic block (CLB) 37 in accordance with various embodiments of the present technology. In the embodiments illustrated in FIG. 9, the block can contain the following: one adder (denoted "+" in FIG. 9), one multiplier (denoted "×" in FIG. 9), one divider (denoted "÷" in FIG. 9), one exponentiation calculator (denoted "e" in FIG. 9), and one comparator (denoted "=" in FIG. 9). There are other elements in this block 37 as well including, but not necessarily limited to, registers and multiplexers. As a result, this block 37 functions like a DSP block in current FPGAs but is tailored to ML applications in the programmable integrated circuit 1 (e.g., FPGA 1) according to the present technology. Moreover, this block 37 is targeted to layers such as batch normalization layer, element wise layer, softmax layer, etc., which are common in ANNs.

Data Types/Formats Supported

Current FPGAs provide arithmetic modules like adders and multipliers in their DSP slices. These arithmetic modules implement either integer arithmetic (e.g. 18×19 multiplication) or single precision floating point arithmetic (fp32) or double precision floating point arithmetic (fp64). With ANNs, however, it has been shown that such high precisions are not necessary. Therefore, the blocks described in the programmable integrated circuit 1 (e.g., FPGA 1) according to the present invention can use data types/formats that are suitable for ML applications.

In the various figures of this disclosure, the data size of each element is not specified. In accordance with various embodiments, all blocks can either be configured in 8-bit integer or fixed precision mode or 16-bit floating point mode or 32-bit IEEE single precision floating point mode. This 8-bit integer mode is commonly used for inferencing or testing applications. The 16-bit floating point mode is commonly used for training or learning applications. The IEEE single precision floating point format (fp32) is also supported.

On-Chip Flash Memory to Store Weights

Weights and activations are the two most important type of data in ANNs. Activations are intermediate outputs of various layers of an ANN. They change and, therefore, are usually either stored in the on-device memory blocks or stored in the connected DRAM (using DDR or HBM). Weights change for training applications and are handled exactly like activations in that case. But weights are fixed for inference applications and that is where Flash memory is useful. The FPGA architecture defined in accordance with various embodiments of the present technology can contain a large Flash memory unit, located on the chip or multichip module, to store weights for all layers of the ANN.

Data Setup for Systolic Multipliers

In some embodiments, a control circuitry, called systolic data setup circuit 15, prepares and provides the data at the right time. A control circuit, called the output data interface circuit 19, can write the data to the output locations in various embodiments. FIG. 10 is an example of control circuitry 1000 for data setting up of a hard matrix multiplier block 7 that may be used in some embodiments of the present technology.

Matrix multiplication is a compute intensive operation. It involves numerous multiply-and-accumulate (MAC) operations. For multiplying a M×K matrix with a K×N matrix to produce a M×N matrix: 1) Number of MAC operations=M*N*K; and 2) Number of memory operations=M*K+K*N+M*N. Various embodiments of the present technology can add hard matrix multipliers 7 as building blocks in current FPGAs.

Hard matrix multipliers as building blocks FPGAs trade off speed for flexibility. Typical ASICs run at clock frequencies that are an order of magnitude faster than frequencies FPGAs can run at (GHz vs 100s of MHz). FPGAs have CLBs that can be used to design any digital logic. CLBs use look-up tables (LUTs) as their building blocks. LUTs with 6 inputs are very common on current FPGA architectures. To make larger designs, LUT based CLBs are connected by using programmable interconnections that consist of routing channels and switch matrices.

Designing a matrix multiplier using soft logic (CLBs and interconnect on an FPGA) yields a slow matrix multiplier. In a simple experiment, a 3×3×3 matrix multiplier was designed on an FPGA architecture that only had CLBs (This FPGA architecture is based on Altera Stratix IV FPGA). 1060 CLBs were used and the resulting frequency of operation was 41.34 MHz. Current FPGAs have hard multipliers and hard MACs in their DSP slices. The ratio of the number of DSP slices to CLBs is generally very low (like 1:200 in some recent FPGAs). DSP slices can be used to design matrix multipliers that are faster than those designed using CLBs. A DSP slice usually contains one or two multipliers or MACs. Matrix multiplication, however, requires many MAC operations (e.g. a 3×3 matrix multiplication requires 27 MAC operations). Therefore, multiple DSP slices have to communicate using the FPGA interconnect resources to make even a small matrix multiplier. This makes such matrix multipliers slower compared to dedicated ASIC matrix multipliers. Also, because the number of DSP slices is limited, many multipliers are implemented using CLBs. These multipliers have even poorer performance and area characteristics. The same 3×3 matrix multiplier mentioned above used 154 CLBs and 12 multiplier (or DSP) blocks when synthesized on a FPGA architecture that had CLBs and multiplier blocks, and the resulting frequency of operation was 69.85 MHz. However, when the same design was synthesized using an ASIC library (a 45 nm library called FreePDK), the frequency of operation was 400 MHz.

Therefore, adding hard matrix multiplier blocks 7 to existing FPGAs can yield faster designs for two reasons: 1) Hardened computation—reducing the dependence on regular FPGA CLBs; and 2) Hardened interconnect—reducing the dependence on regular FPGA interconnect. In general, implementing a function (here, a GEMM) using specific-purpose logic blocks (matmuls) means better area, speed and power consumption over its implementation in general purpose logic blocks (CLBs).

Implementation of the Hard Matrix Multiplier Building Block

Multiple implementations of a matrix multiplier are possible. A completely parallel implementation, in which all the MAC operations happen at the same time, requires a lot of die area. A completely serial implementation, in which there is only one MAC, is very slow in producing the final result. Most other implementations trade-off area consumed and time required to produce the final result.

Systolic array architectures for matrix multipliers have been deployed in many designs. Systolic architectures have many interesting properties, with the most important being reusing a piece of data multiple times and never having to read it again, making them very efficient for compute-intensive tasks like matrix multiplications. Various embodiments can use systolic array based architecture. Some of the experiments presented below use this architecture.

A systolic array based implementation of a matrix multiplier used in various embodiments includes three pieces of logic: 1) MACs (or processing elements 13) arranged in the form of an array; 2) An input data setup circuit that fetches the input data and provides the data to the MACs at the right time; and 3) An output interface circuit 19 that writes the data to the output.

FIG. 10 also shows the systolic matrix multiplier interfaced with BRAMs on an FPGA. A systolic array based matrix multiplier is sometimes also said to use "wave" pipelining, because the output travels in the form of a wave along the diagonal of the output matrix. There are multiple types of systolic array implementations as well—some in which outputs flow through the array of processing elements, some in which the outputs are stationary in the array of processing elements, etc. Design R1 was used for the experiments discussed below. Note that the benefits of providing matmuls on an FPGA don't depend on the type of the matmul implementation chosen. In some embodiments, a systolic implementation can be selected based on the symmetry in the design of a systolic matrix multiplier enables easy composition of multiple small matmuls into larger matrix multipliers.

Size of the Hard Matrix Multiplier Building Block

The next question that arises is what size of matrix multiplier blocks should be provided on an FPGA. In general, there are area, speed and power tradeoffs when comparing building blocks of different sizes. When large problem sizes exist (which is typical in state-of-the-art neural networks), composing large matrix multipliers using smaller matmuls means using the regular FPGA interconnect, which adds additional delays and slows down the overall frequency of operation. Larger matmuls (e.g., a 16×16×16 matmul) lead to higher speed, lesser area and lesser power consumption for a given design, but they also lead to more routing area per block and increased channel width. Not having switchboxes inside the matmuls means the average wire length required for routes further increases (adversely affecting the case with larger matmuls more than the case with small matmuls).

For the experiments discussed below, only square sized matrix multipliers (M=N=K) were considered with sizes starting from 4×4×4 to 8×8×8 to 16×16×16 to 32×32×32. The power of 2 numbers were used because most start-of-the-art networks use sizes that are a power-of-2. However, other embodiments may use different geometrical configurations or base units.

The problem of underutilization or fragmentation happens when a big matrix multiplier block (e.g., 32×32×32) is available, but a smaller problem size (e.g., 24×24×24). This can also happen when a larger problem size (e.g., 20×20×20) is being solved, but matrix multipliers that are available are smaller and don't evenly divide the edges of the problem size (e.g., 16×16×16). Providing smaller sized matrix multipliers on an FPGA means having lesser underutilization and fragmentation problems, compared to providing larger sized matrix multipliers.

Figure 11:
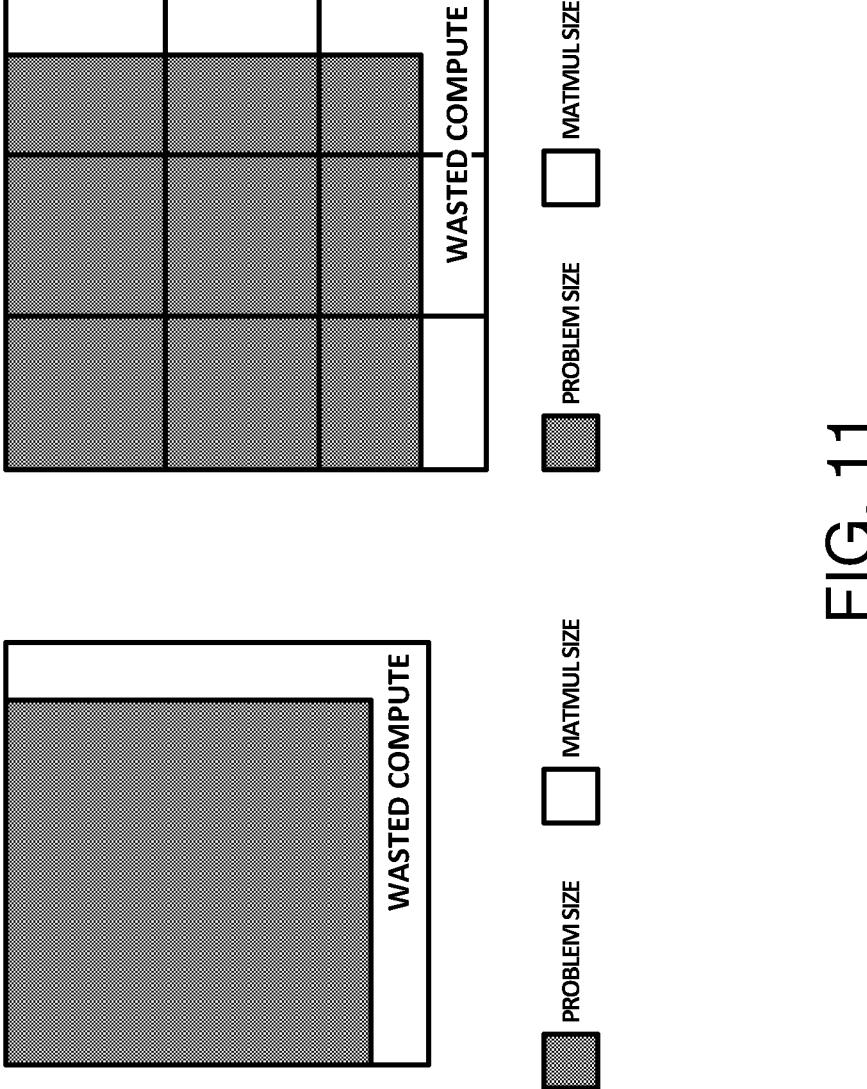
FIG. 11 illustrate an example of under-utilization or fragmentation.

FIG. 11 shows that the regular composition requires 8 separate matrix multiplications and 4 matrix additions. Choosing the size of a building block for matrix multiplication is similar to choosing the granularity of any building block of an FPGA. The spectrum ranges from multipliers as building blocks, to MACs, to small matrix multipliers, to large matrix multipliers. One option that we also considered in this spectrum of granularity was to provide a systolic multiplier without the input data setup circuit and the output interface circuit. In other words, a set of hard interconnected MACs and flops, through which data can move systolically. This is different than just providing MACs as a building block, because the interconnections between the MACs in the block are hardened. Similarly, the flops to move data from one processing element to the next are hardened. This results in a faster design than just providing MACs as a building block. The disadvantage of this approach, compared to providing a full matrix multiplier block as a building block, is that input data setup logic and output control logic has to be designed using CLBs, which can reduce the clock frequency of the design. The results from experiments comparing various matmul sizes are discussed in more detail below.

Composing Building Blocks to Make Bigger Matrix Multipliers

State-of-the-art neural networks require matrix multiplications of varying sizes, most of them being very large. Large matrix multiplications can be done by composing smaller matrix multipliers. Below are two ways of composing matrix multipliers that may be used in some embodiments of the present technology—regular composition and systolic composition.

Figure 12:
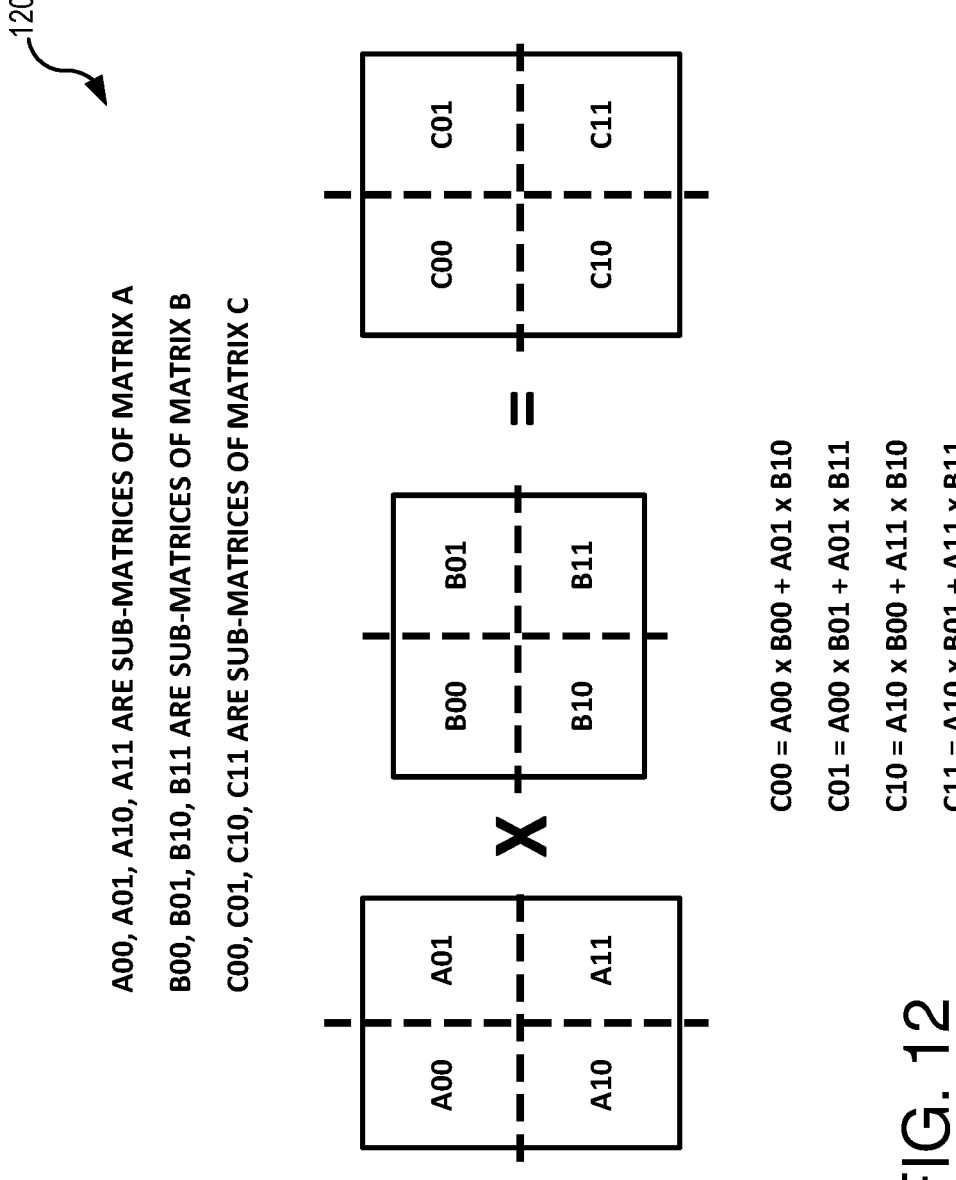
FIG. 12 shows that the regular composition requires 8 separate matrix multiplications and 4 matrix additions.
Figure 13:
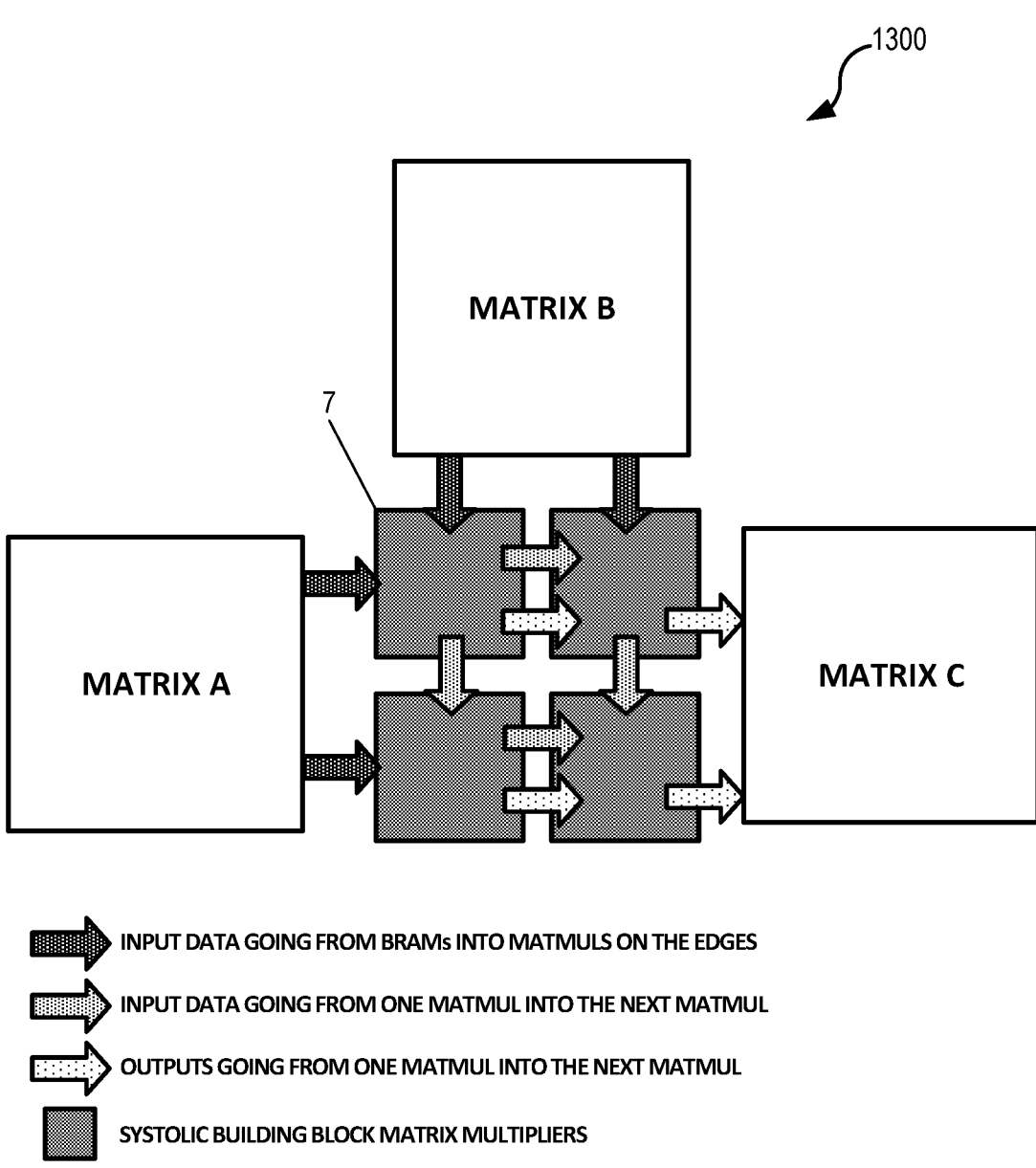
FIG. 13 is an example of a systolic composition that can be performed by connecting 4 systolic matrix multipliers in accordance with various embodiments of the present technology.

FIG. 12 is an example of a systolic composition 1200 that can be performed by connecting two systolic matrix multipliers in accordance with various embodiments of the present technology. In the embodiments illustrated in FIG. 12, multiple 4×4×4 matrix multipliers are composed to create a 8×8×8 matrix multiplication. This scheme requires 8 4×4×4 matrix multipliers and 4 matrix additions. FIG. 13 is an example of a systolic composition 1300 that can be performed by connecting four systolic matrix multipliers in accordance with various embodiments of the present technology. FIG. 13 shows composing multiple 4×4×4 matrix multipliers to do a 8×8×8 matrix multiplication. This scheme requires 4 4×4×4 matrix multipliers.

The regular composition scheme illustrated in FIG. 12 produces the result in a fewer cycles, but needs more hardware resources. On the other hand, the systolic composition scheme takes a greater number of cycles to produce the result, but it uses fewer hardware resources. In the systolic scheme 1300 illustrated in FIG. 13, the resulting larger matrix multiplier is a fully systolic matrix multiplier, which means that it has high compute efficiency (data is read once and re-used multiple times). Only the matmul blocks 7 along the top and left edges of the larger multiplier fetch data from memory (similar to how only the PEs 13 along the top and left edges of systolic matmul 7 block do). The other matmul blocks 7 receive inputs from their neighboring matmuls 7 (similar to how the PEs 13 within a systolic matmul 7 block receive data from their neighbors). In the regular composition scheme, however, the same input data (matrix A and B) has to be read from BRAMs multiple times by different matmul blocks.

Such a systolic composition 1300 can be done using two methods. In the first method, the connection between the smaller matrix multipliers is done using the regular FPGA interconnect. In the second method, the connection between the smaller matrix multipliers is done using programmable (e.g., direct) interconnect 9. This programmable interconnect 9 is an additional element of the architecture described herein. This interconnect 9 is provided from each building block matrix multiplier to two other neighboring building block matrix multipliers—one to the right and one to the bottom. The word "programmable" is generally used to denote that these connections are configurable, and are configured at the same time with other FPGA interconnect (s). The word "direct" is generally used to denote that these connections are different from the regular routing channels and the switch matrix in the FPGA. This keeps the delay through these interconnect to a minimum.

One advantage of having direct programmable interconnect(s) 9 and of the systolic nature of the matrix multipliers is that the critical path does not increase as the bigger matrix multipliers become bigger, enabling bigger matrix multiplies to be run at the same clock frequency as smaller matrix multipliers. And this frequency is higher than the frequency obtained when the building block is a multiplier or a MAC. The presence of programmable direct interconnect influences the decision of the size of the matrix multiplier building blocks. Programmable (e.g., direct) interconnect helps reduce the disadvantages of smaller sized building blocks mentioned in the previous section.

Placement of the Hard Matrix Multiplier Building Block

Figure 14A:
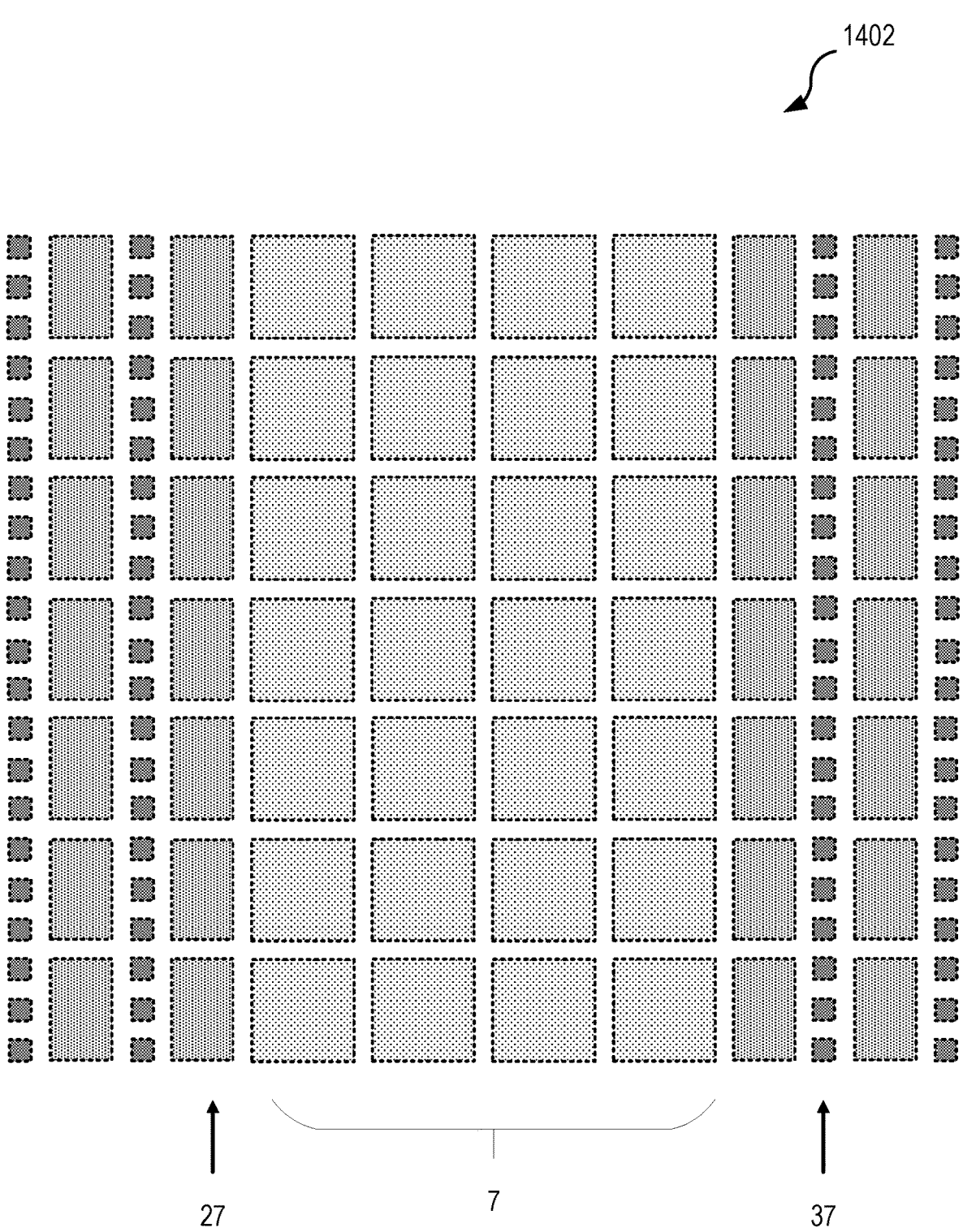
FIG. 14A-14C illustrate various placement strategies that may be used in some embodiments of the present technology.
Figure 14B:
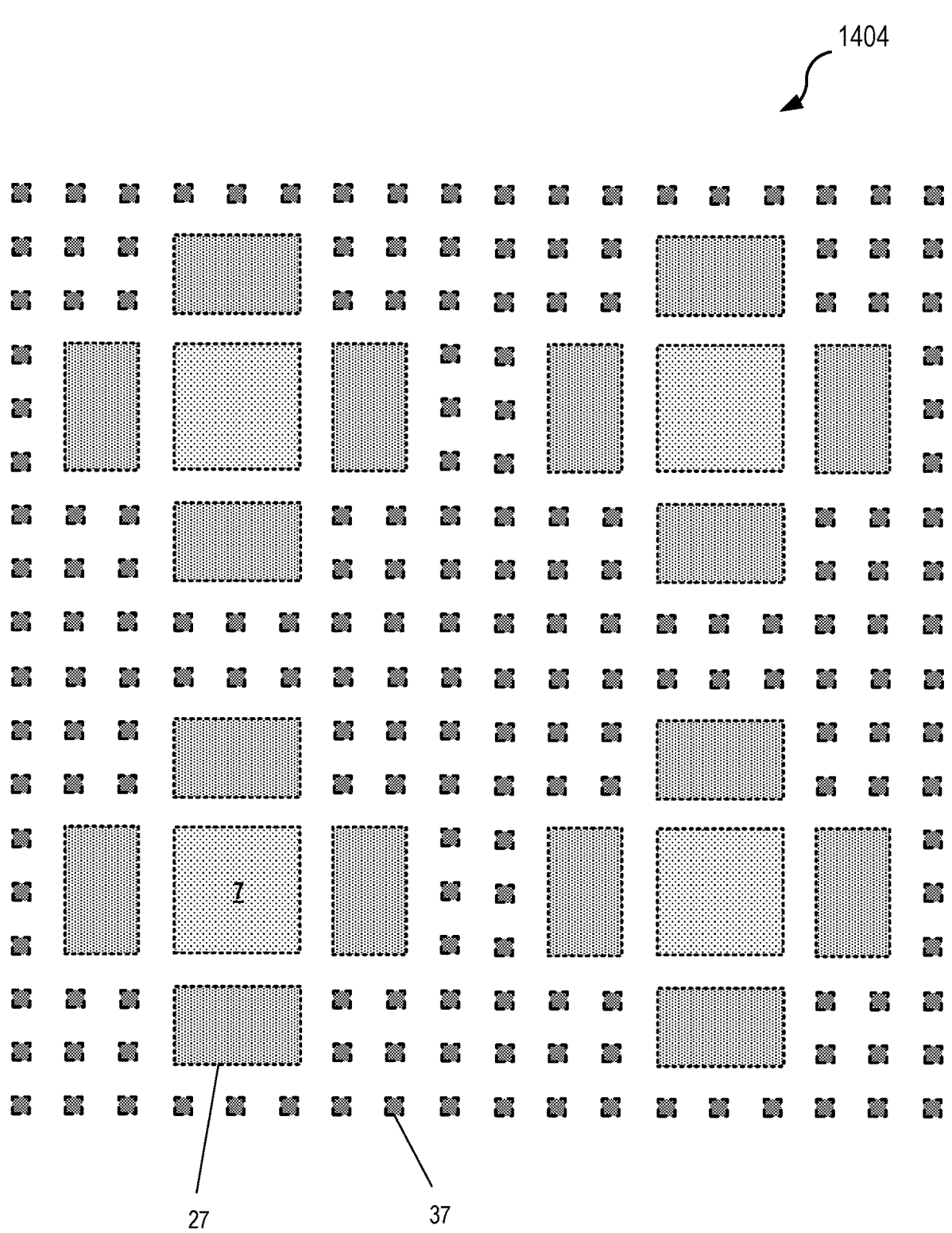
Figure 14C:
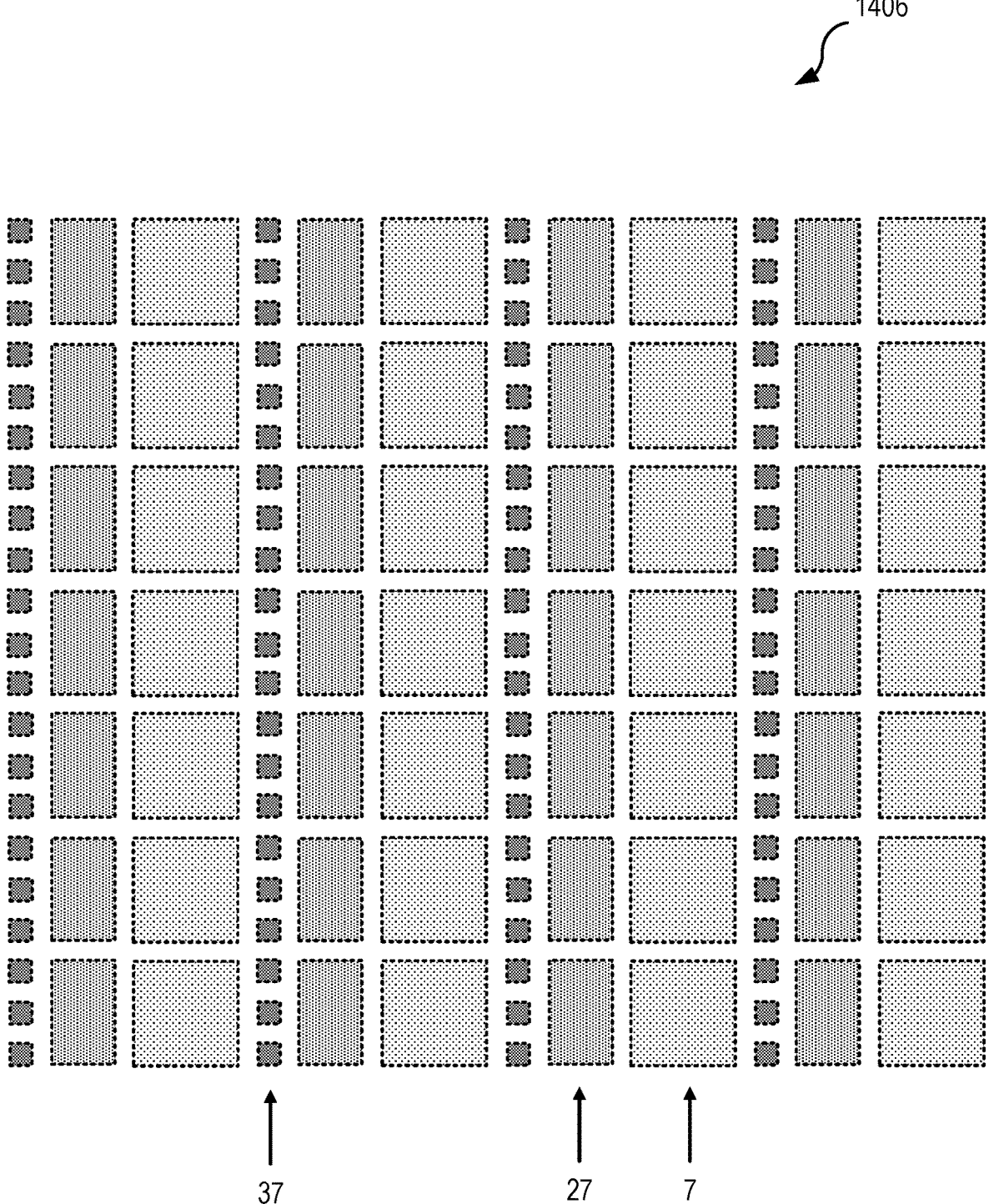

FIG. 14A-14C illustrate various placement strategies that may be used in some embodiments of the present technology. Not only is it important to add the matmul 7 blocks, careful placement of the matmul blocks 7 to the FPGA fabric is important as well for the programmable integrated circuit 1 according to the present technology. We explored several placement options for these blocks along-side the other blocks on the FPGA. In the "Clustered" placement 1402 method (shown in FIG. 14A), the matmuls 7 were clustered together on the FPGA, in columns around the middle of the FPGA, so that the programmable direct interconnect 9 between them is the shortest and hence, the fastest. In this case, the matmuls 7 on the edges of the cluster are closer to other building blocks like BRAMs and CLBs, but most of the matmuls 7 in the cluster are not. The asymmetric nature of this placement makes it a poorer choice compared to some options mentioned below, because depending on the design being overlayed, the critical path can vary greatly. Placing large building blocks close to each other leads to an increase in the routing channel width as well.

In the "Surround" placement 1404 method (shown in FIG. 14B), the matmuls 7 are placed such that they are surrounded by BRAMs 27 and CLBs 37. In this method, the distance between neighboring matmuls 7 is higher than the "Clustered" method, but each matmul 7 is close to CLBs 37 and BRAMs 27.

In the "Columnar" placement 1406 method (shown in FIG. 14C), columns of matmuls 7 were spread evenly between columns of other blocks like CLBs 37 and BRAMs 27. "Columnar" 1404 and "Surround" 1406 placements are symmetric and so, whatever the size of the design be, the BRAMs 27, that feed the matmuls 7, are always almost equidistant from the matmuls 7. This making these placements the flexible and scalable.

Experimental Methodology

Multiple tools were used to perform the experiments for these embodiments including, VTR for FPGA architecture exploration, Synopsys®VCS for Verilog simulations, and Synopsys®Design Compiler for synthesizing designs using an ASIC standard cell library. How these tools were used and which experiments were performed are described below.

For all the experiments done, here are some parameters and assumptions that were taken. Data type for all the operations, except accumulation, was uint16 (16-bit unsigned integer). Accumulation was done with 32 bits. The results might differ slightly for other data types like IEEE Half-precision Floating Point (fp16) or 8-bit unsigned integer (uint8) or Intel®'s bfloat16, but the overall conclusion does not change.

The base FPGA architecture used for these experiments is an approximation of the Intel®Stratix IV GT FPGA architecture, that is available with VTR (k6_frac_N10_mem32K_40 nm.xml). Here are the important features of this architecture: 40 nm technology island-style FPGA; CLBs: 6-LUT based, can alternatively operate as two 5-LUTs with shared inputs; Fracturable BRAMs: 32 Kb memory that can operate from 512×64 to 32K×1 for single-port mode and 1024×32 to 32K×1 for dual-port mode; Fracturable multipliers: 36×36 multiplier that can fracture to two 18×18 multipliers each of which can further fracture to two 9×9 multipliers; and Routing architecture: L=4, Fc_in=0.15, Fc_out=0.1, Wilton switches with Fs=3. In the tested embodiments, the multipliers in this architecture were replaced with DSP slices to make the baseline FPGA similar to current commercial architectures. The DSP slice can act as a MAC (16 bit*16 bit+32 bit) or a multiplier (16 bit*16 bit) or an adder (16 bit+16 bit).

The ASIC library is the FreePDK45 library used for educational research. While synthesizing designs using the ASIC library, "typical" operating conditions were selected. Whenever required, the timing and area numbers obtained using this library were scaled/adjusted to make them suitable to be used with the 40 nm FPGA architecture mentioned above and ensure apple-to-apple comparison. A 15% area overhead of place and route was assumed.

For the FPGA with hard matrix multiplier blocks, the architecture mentioned above was used, but the DSP slices were replaced with matmul blocks. The area of the 4×4×4 matmul building block was 9 times compared to the area of 1 tile, so its geometry was defined to be 3 tiles×3 tiles. The matmul building blocks were defined to have switch boxes inside them because that leads to better routability. Moreover, they were defined to have pins evenly distributed along the perimeter.

To obtain the grid sizes for the regular FPGA and the FPGA with matmuls, we identified the minimum number of resources (CLBs, MACs, matmuls, etc.) required for our largest design (64×64×64 matrix multiplier). For example, for a regular FPGA, 4096 MACs were required. Similarly, for an FPGA with 4×4×4 matmuls, 256 matmuls were required. We then multiplied this minimum required number of resources by 1.5, so that the placement and routing tool has enough flexibility. The resulting grid sizes were 302× 302 for the regular FPGA, and 86×86 for the FPGA with matmuls. Clearly, a smaller grid size is required for the FPGA with matmuls.

For all experiments involving the FPGA with matmuls, the FPGA size and layout was kept fixed for all design sizes, so as to not favor any specific design size. The FPGA size and placement strategy was kept fixed for all experiments with different matmul sizes, so as to not favor any specific matmul size. VTR's auto_layout option was disabled and fixed_layout was used. When comparing between a regular FPGA and a FPGA with matmuls, the architecture of the Verilog designs used was the same (no specific optimizations were done to favor a specific FPGA architecture).

The steps that were involved in finding the benefits of hard matrix multiplier blocks were:

1) Design the building block (say a 4×4 matrix multiplier) in Verilog and simulate it to ensure it's functionality is correct.
2) Synthesize the building block using a standard cell library to find out the area and the timing information for the block.
3) Write an FPGA architecture file for VTR that has this building block's details, including the area and timing information obtained from step 2. This FPGA is referred to as the experimental FPGA.
4) Code a design to implement on the experimental FPGA from step 3. This design implements a large matrix multiplier of a give problem size using the building blocks from step 1.
5) Provide the design from step 4 and the architecture file from step 3 to VTR. Observe/record the timing, area and resource consumption values from the generated reports.
6) Take the design from step 4 and add to it the Verilog definition of the building block, so that the building block is no longer the leaf level.
7) Provide the design from step 6 and a baseline architecture file (an FPGA not containing the matmuls; everything else being the same) to VTR. Observe/record the timing, area and resource consumption values from the generated reports.
8) Compare the results from steps 5 and 7 to obtain the speedup provided by the experimental FPGA.

These steps were repeated for various building block sizes and for various problem sizes.

Systolic composition of building block matrix multipliers is made possible by providing programmable direct interconnect from each matrix multiplier to two nearby matrix multiplier blocks—one to the bottom and one to the right. VTR's FPGA architecture specification language does not have a way to specify programmable direct interconnect, but it does support specifying direct inter-block connections. A common example of this is to model the carry chains between CLBs with adders, that are present in current FPGA architectures.

This feature of VTR's architecture specification language was used to model the programmable direct interconnections between various matrix multiplier building blocks. Although not completely precise, this gets us really close. The steps taken to identify the benefit of systolic composition of hard matrix multiplier building blocks were:

1) Code a design in Verilog where multiple matmuls are used to create a bigger matrix multiplier, non systolically.
2) Code an experimental FPGA architecture file containing area, timing and other information of the matmul block.
3) Provide the design from step 1 and the architecture from step 2 to VTR. Observe/record the timing and area values from the generated reports.
4) Code a design in Verilog where multiple matmuls are used to create a bigger matrix multiplier, systolically.
5) Provide the design from step 3 and the architecture from step 2 to VTR. Observe/record the timing and area values from the generated reports.
6) Update the experimental FPGA architecture from step 2 to add direct connections between neighboring matrix multi-plier blocks.
7) Provide the design from step 3 and the architecture from step 6 to VTR. Observe/record the timing and area values from the generated reports.
8) Compare the results from steps 3, 5 and 7.

To analyze the various placement strategies of matmul blocks, following steps were taken:

1) Code a design in Verilog where matmul blocks are used to a create bigger matrix multiplier. Also, there are 1 or more matrix multipliers in the design (say 3 8×8×8 matrix multipliers using 4×4×4 matmul building blocks).
2) Code an experimental FPGA architecture file that has the matmuls blocks used in the design in step 1 as building blocks. Specify a placement of the matmul blocks in the architecture file.
3) Provide the design from step 1 and the architecture from step 2 to VTR. Observe/record the timing values (critical path) from the report.

Steps 1-3 were repeated for different design sizes (4×4×4 to 32×32×32) and the 3 different placement strategies mentioned in 3.5.

The various layers were then classified in today's neural networks into two categories: 1) GEMM layers. These layers perform matrix multiplication. Fully connected layers and convolution layers are expressed as GEMMs. Because of the nature of matrix multiplication, these layers are compute bound. These are the layers that our proposal tries to improve. 2) Non-GEMM layers. These layers include other tasks like batch normalization, element wise additions, activations (relu, sigmoid, etc.). All these tasks are memory bound, because for every element read from the memory, the amount of computation done is not high.

Data for these layers (GEMM dimensions, number of bytes read, number of bytes written, etc.) was collected from the MLPerf benchmarks. To calculate the overall speedup provided by the proposed FPGA for running a neural network (GEMM layers and non-GEMM layers), the time taken by each layer on the proposed FPGA and on a regular FPGA was calculated. To calculate the time taken for GEMM layers, the following steps were taken:

1) Identify the number of cycles that will be taken to perform the matrix multiplication for a layer in an experimental FPGA architecture. We wrote an analytical model for doing this. Here are some highlights of the model:

a. The largest systolic multiplier possible on the FPGA is governed by the total number of matrix multiplier building blocks (this size is referred to as M'×N'×K').

b. The layer's GEMM was split into multiple M'×N'×K' matrix multiplications, and the results were composed non-systolically.

c. Reduction adds were assumed to be done by adders that could run in a pipelined fashion with the matrix multiplication. Enough adders were always assumed to be available.

d. The fragmented parts of the GEMM (i.e., parts that were smaller M'×N'×K') were handled by building block matrix multipliers.

2) Identify the clock frequency of the M'×N'×K' matrix multiplier for our experimental FPGA with matmuls using the above described methodology. This is the clock frequency the design will operate at on our FPGA.

3) Multiply the number of clock cycles obtained in step 1 with the clock frequency obtained in step 2, to get the total time taken for computation of this layer on our FPGA.

4) Identify the clock frequency of the M'×N'×K' matrix multiplier for a regular FPGA (with no matmul blocks) using the above described methodology. This is the clock frequency the design will operate at on a regular FPGA.

5) Multiply the number of clock cycles obtained in step 1 with the clock frequency obtained in step 4, to get the total time taken for computation of this layer on a regular FPGA.

Since non-GEMM layers are memory bound, the time consumed by these layers is the same as time taken to read the operands for these layers from DRAM and to write the results back to DRAM. For this, the number of bytes read/written by each layer was calculated, and divided that by the DRAM bandwidth available on FPGAs (the value of 100 GB/s were used because of the use of Stratix IV in the tested architecture, which was used around 2008-09 and GPUs at the time had approximately 100 GB/s bandwidth). This time was used as the time consumed by non-GEMM layers on our proposed FPGA as well as on a regular FPGA, because our proposal does not affect this time at all. We repeated this exercise for multiple state-of-the-art neural networks from MLPerf benchmark suite.

It is important to note that any techniques (hardware or software) to minimize reading and writing from DRAM (like keeping as much data as possible in on-chip BRAMs and reusing it, or fusing memory bound operations, say ReLU, with compute bound operations, say GEMM) will actually help in amplifying the overall benefit mentioned above. The benefit we've calculated assumes the pessimistic case of reading and writing all data required for memory bound layers.

Benefits of hard matrix multiplier blocks: Table 1 compares the properties of a 4×4×4 matrix multiplier when implemented using an ASIC, an FPGA with only CLBs, and an FPGA with CLBs and MACs. This shows that if matrix multipliers implemented using ASIC library were available as hard matmuls in an FPGA, matrix multiplication operations on such the FPGA will be accelerated significantly.

TABLE 1

Properties of a 4 × 4 × 4 design implemented on ASIC and a regular FPGA

| Property | FGPA with CLBs | FPGA with DSP slices | ASIC |
|---|---|---|---|
| Crit. path (ns) | 19.67 | 6.19 | 1.62 |
| Clk freq. (MHz) | 50.83 | 161.40 | 617.28 |
| Area (MWTA) | $4.68 \times 10^8$ | $3.60 \times 10^8$ | $8.87 \times 10^5$ |
| Resources | 897 CLBs | 87 CLBs, 16 MACS, 8 multipliers, 33 adders | 1175 standard cells |

Figure 15:
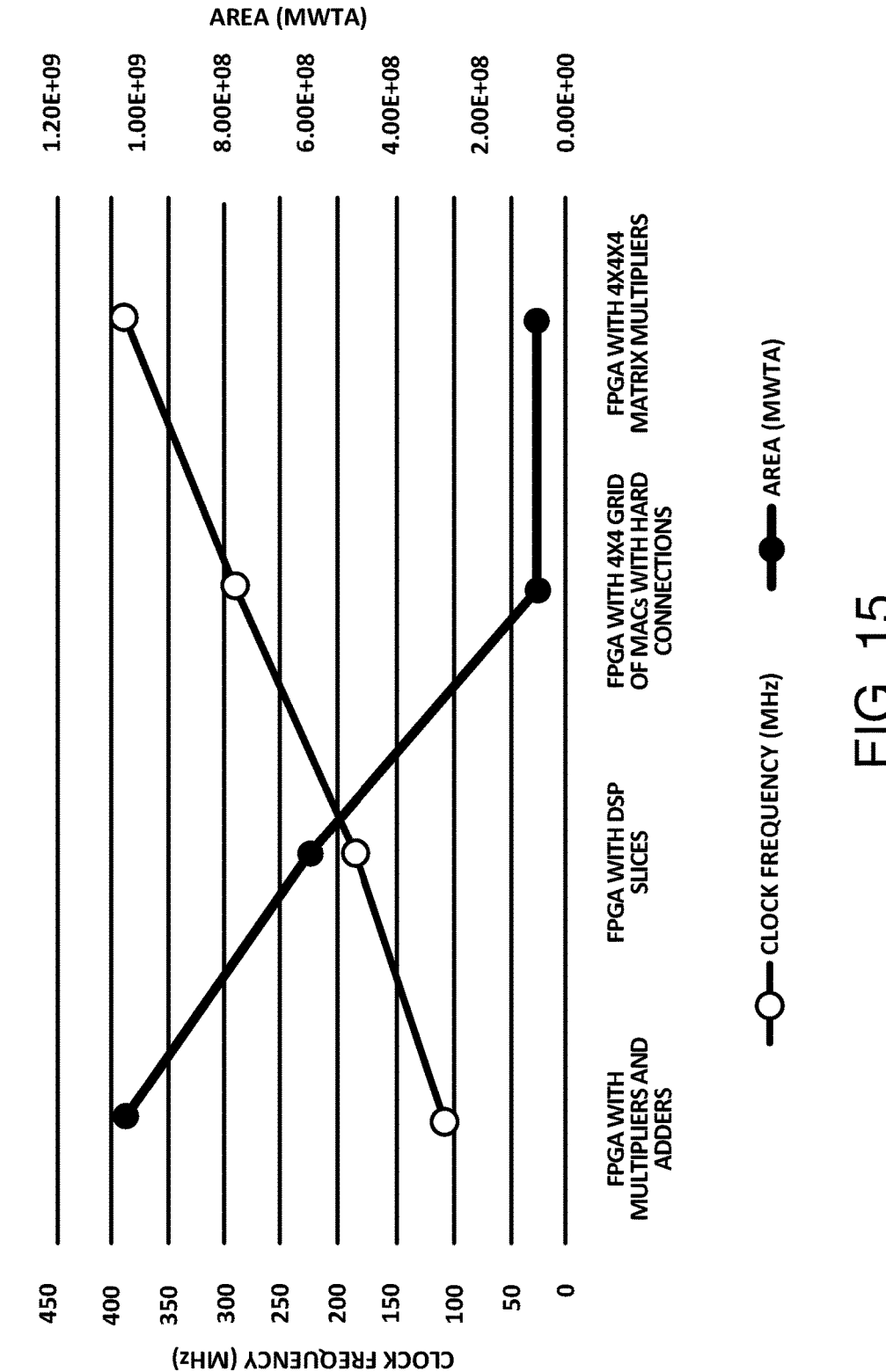
FIG. 15 is a plot of the clock frequency and area for a 8×8×8 matrix multiplier design with decreasing granularity of the compute element.

FIG. 15 shows a plot 1500 of the clock frequency achieved when a design (8×8×8 matrix multiplier) was implemented using various types of FPGAs. The number of clock cycles is governed by the Verilog RTL design, and is therefore the same for each FPGA. The total time taken to complete the matrix multiplication is obtained by multiplying the clock frequency of the resulting design with the number of clock cycles it takes to generate the result. From the figure, we can observe that as we move from left to right, the clock frequency increases. Since systolic arrays have near neighbor connections, even an array of DSP slices are quite effective, however, the control logic implemented in CLBs worsen the critical path. The total area reduces as we move from left to right, which is expected because more logic and interconnect is being hardened. A proportional reduction in power consumption can be expected.

Table 2 shows the results obtained when larger matrix multipliers are composed using 4×4×4 matmul blocks.

TABLE 2

Different design sizes using a regular FPGA with DSP slices and an FPGA with 4 × 4 × 4 matmul blocks

| | FPGA with matmuls | | FPGA with DSP slices | |
|---|---|---|---|---|
| Design Size | Critical path (ns) | Area (MWTA) | Critical path (ns) | Area (MWTA) |
| 4 × 4 × 4 | 2.52 | $3.3 \times 10^7$ | 5.21 | $3.1 \times 10^8$ |
| 8 × 8 × 8 | 2.61 | $6.9 \times 10^7$ | 5.42 | $6.0 \times 10^8$ |
| 16 × 16 × 16 | 2.60 | $1.0 \times 10^8$ | 5.58 | $8.7 \times 10^8$ |
| 24 × 24 × 24 | 2.62 | $1.3 \times 10^8$ | 5.70 | $1.1 \times 10^9$ |
| 32 × 32 × 32 | 2.70 | $1.7 \times 10^8$ | 6.40 | $1.4 \times 10^9$ |
| 40 × 40 × 40 | 2.91 | $2.1 \times 10^8$ | 7.72 | $1.6 \times 10^9$ |
| 48 × 48 × 48 | 2.94 | $2.6 \times 10^8$ | 8.55 | $2.2 \times 10^9$ |
| 64 × 64 × 64 | 3.11 | $3.7 \times 10^8$ | 9.09 | $2.9 \times 10^9$ |

Because of the availability of programmable direct interconnect, and the systolic nature of the matmuls, the frequency doesn't increase much as larger multipliers are implemented. This is very useful because when larger matrices are to be multiplied, a large systolic matrix multiplier could be created using smaller multipliers, without sacrificing the speed. Otherwise non-systolic composition would have to be done which needs more hardware and is not as compute-efficient. For the 64×64×64 design, we can see a reduction of ~8× in total area and a speedup of ~3× in clock frequency when 4×4×4 matmuls are used, compared to a regular FPGA with DSP slices. The benefit will increase as larger matrix multiplier designs (say 96×96×96) are compared.

Different sizes of matrix multipliers were used to identify the best size for a hard matrix multiplier for an FPGA. A design that had a 70×70×70 matrix multiplier was implemented, using various smaller building block sizes –4×4×4 building block, 8×8×8 building block, and so on.

Table 3 shows the results from these experiments. Because of fragmentation effects, more time was consumed when larger matmuls are used. The utilization of the matmuls is much higher with smaller building blocks.

TABLE 3

A matrix multiplier with high fragmentation problems (70 × 70 × 70) designed using different matmul sizes

| Matmul | Freq. (MHz) | Time (μs) | Area (MWTA) | Util |
|---|---|---|---|---|
| 4 × 4 × 4 | 320.77 | 1.80 | $3.73 \times 10^8$ | 0.796 |
| 8 × 8 × 8 | 298.14 | 2.00 | $3.53 \times 10^8$ | 0.783 |
| 16 × 16 × 16 | 241.79 | 2.87 | $3.55 \times 10^8$ | 0.590 |
| 32 × 32 × 32 | 211.90 | 4.78 | $3.46 \times 10^8$ | 0.442 |

Figure 16:
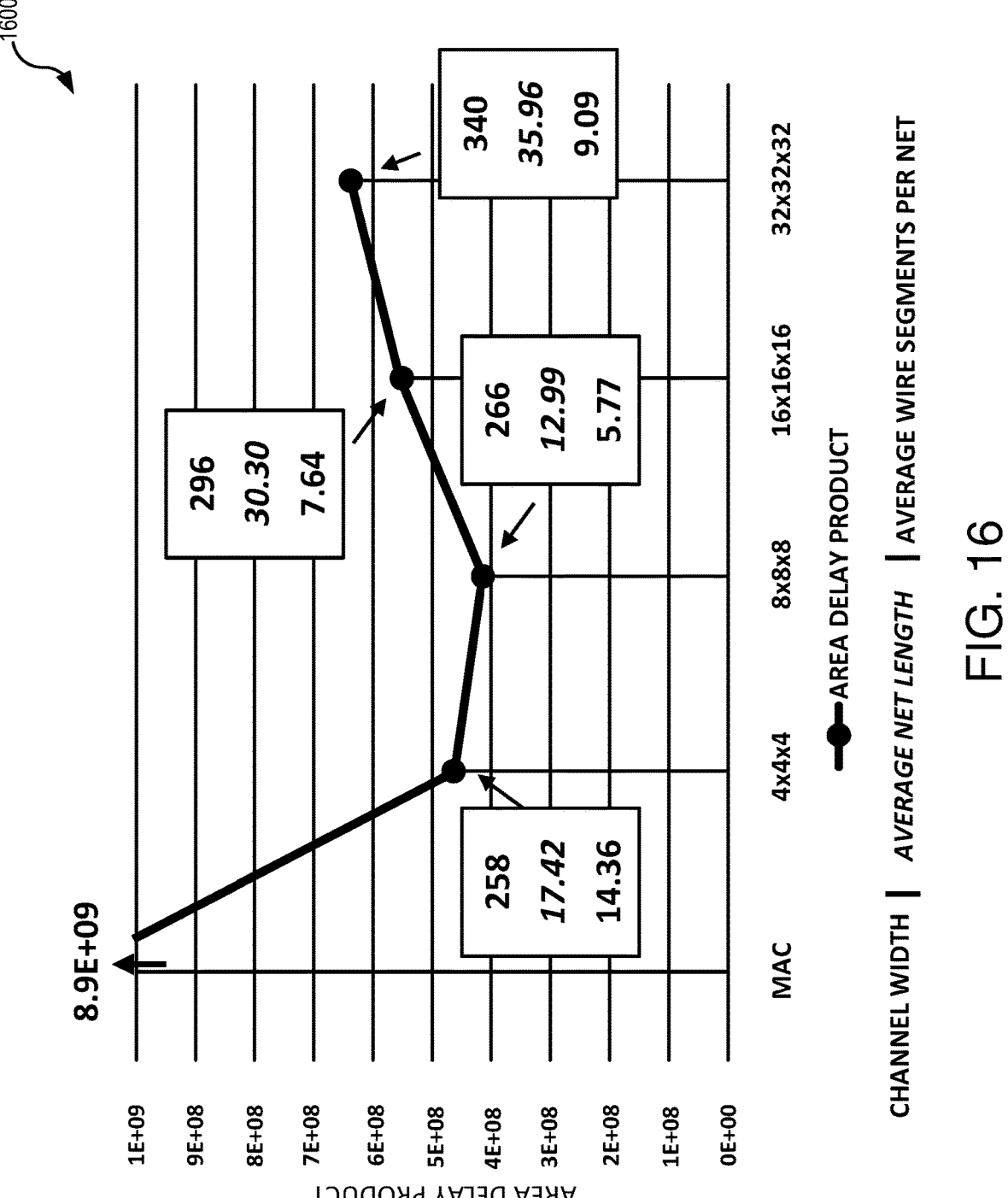
FIG. 16 is a plot of area-delay product of a matrix multiplier with no fragmentation problems (32×32×32) designed using varying granularity of the compute element.

For a design size without fragmentation issues, we see that an 8×8×8 building block performs slightly better. FIG. 16 is a plot 1600 showing the area-delay product for a 32×32×32 matrix multiplier design using the different granularities of the main compute element. Note that the area-delay product significantly improves as we move from using a MAC to a 4×4×4 matrix multiplier. Then, it improves slightly for the case with 8×8×8 matmul and then starts to degrade. The clock frequency when using an 8×8×8 matmul was lower because the average net length was higher, but the logic and routing areas were lower, causing 8×8×8 matmul to have a better area delay product. With matmuls larger than 8×8×8, although the total area reduced, the frequency decreased because average net length and average wire segments per net increased. The channel width also increased when larger matmuls were used.

Considering both fragmentation effects and the area delay product, providing 4×4×4 matmuls in FPGAs is recommended.

Figure 17:
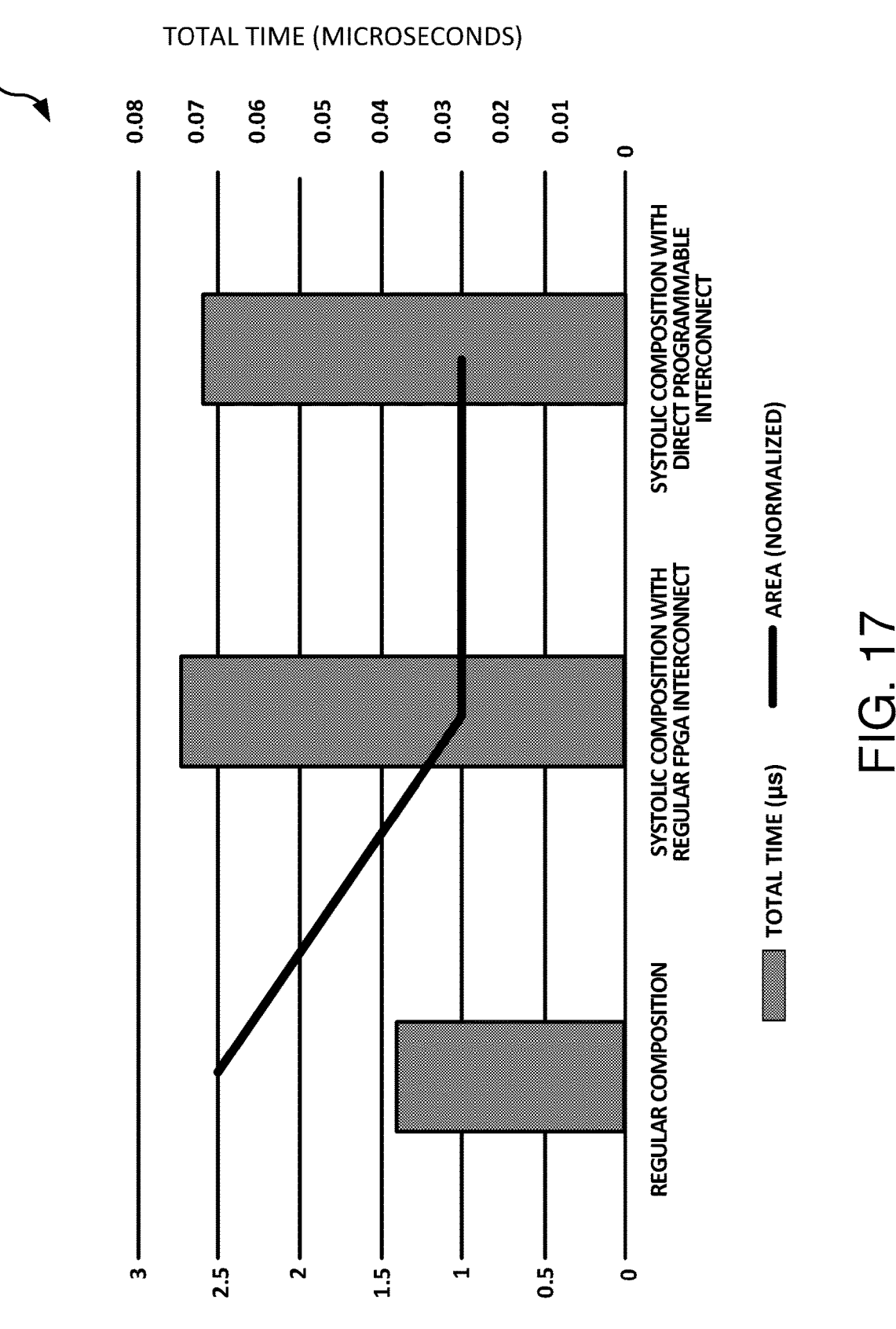
FIG. 17 is a plot illustrating a comparison of different approaches to composition that may be used in some embodiments of the present technology.

FIG. 17 is a plot 1700 illustrating a comparison of different approaches to composition that may be used in some embodiments of the present technology. In this experiment, the final design was a 8×8×8 multiplier and the size of the matmul blocks was 4×4×4. Non-systolic composition requires double the area because it needs eight 4×4×4 matmuls, as compared to four 4×4×4 matmuls in the systolic expansion case. The clock frequency at which the non-systolic expansion design can be implemented is almost the same as the clock frequency at which the systolic expansion design can be implemented, but non-systolic expansion takes shorter time because it requires a smaller number of clock cycles.

Plot 1700 in FIG. 17 shows the benefit in clock frequency when direct programmable interconnects were used to connect the matmul blocks. Depending on the proximity of matmul blocks to each other in the layout of the FPGA, direct programmable interconnect can have a different benefit. If the critical path of the design includes the interconnect between neighboring matmuls, then direct programmable interconnect can be used to improve performance.

Table 4 shows the critical path for various design sizes using different placement strategies mentioned above. The building block matmul size used for these experiments was 4×4×4. In the "Clustered" placement 1402, the large distance of the matmuls deep inside the cluster from the BRAMs and CLBs increases routing delays. Because the matmuls are close to each other, the channel width requirement is very high. The "Surround" placement 1404 gives good results for smaller design sizes, but as the design size increases, the critical path increases. This is because the average net length increases as the matmuls are far apart from each other, compared to the "Columnar" placement 1406. The total area of the design is also larger with the "Surround" placement 1404 because of the same reason. The "Surround" placement 1404 has the lowest channel width because of the least routing congestion. For the "Columnar" placement 1406 the critical path does not vary greatly as the design size increases and the total area is small. The channel widths are lower than the "Clustered" placement 1402 and higher than the "Surround" placement 1404. However, the ratio of number of CLBs to matmuls in "Columnar" placement 1406 is low and so the FPGA is not going to be as versatile.

TABLE 4

Comparing different placement strategies (C = Critical Path (ns), A = Area (MWTA xE08), W = Channel Width)

| | Clustered | | | Surround | | | Columnar | | |
|---|---|---|---|---|---|---|---|---|---|
| Design | C | A | W | C | A | W | C | A | W |
| 4 × 4 × 4 | 2.5 | 0.33 | 66 | 2.3 | 1.4 | 62 | 2.5 | 0.33 | 66 |
| 8 × 8 × 8 | 2.6 | 0.69 | 154 | 2.4 | 2.2 | 104 | 2.6 | 0.69 | 154 |
| 16 × 16 × 16 | 4.0 | 1.3 | 288 | 3.0 | 2.4 | 104 | 2.6 | 1.0 | 198 |
| 24 × 24 × 24 | 4.1 | 1.6 | 326 | 3.3 | 2.7 | 112 | 2.6 | 1.3 | 234 |
| 32 × 32 × 32 | 4.1 | 2.2 | 410 | 3.2 | 3.0 | 111 | 2.7 | 1.7 | 260 |
| 40 × 40 × 40 | 4.2 | 2.7 | 460 | 3.4 | 3.3 | 110 | 2.9 | 2.1 | 260 |
| 48 × 48 × 48 | 4.2 | 3.2 | 478 | 3.5 | 4.0 | 124 | 2.9 | 2.6 | 306 |
| 64 × 64 × 64 | 4.2 | 4.4 | 496 | 4.1 | 5.1 | 124 | 3.1 | 3.7 | 292 |

Figure 18:
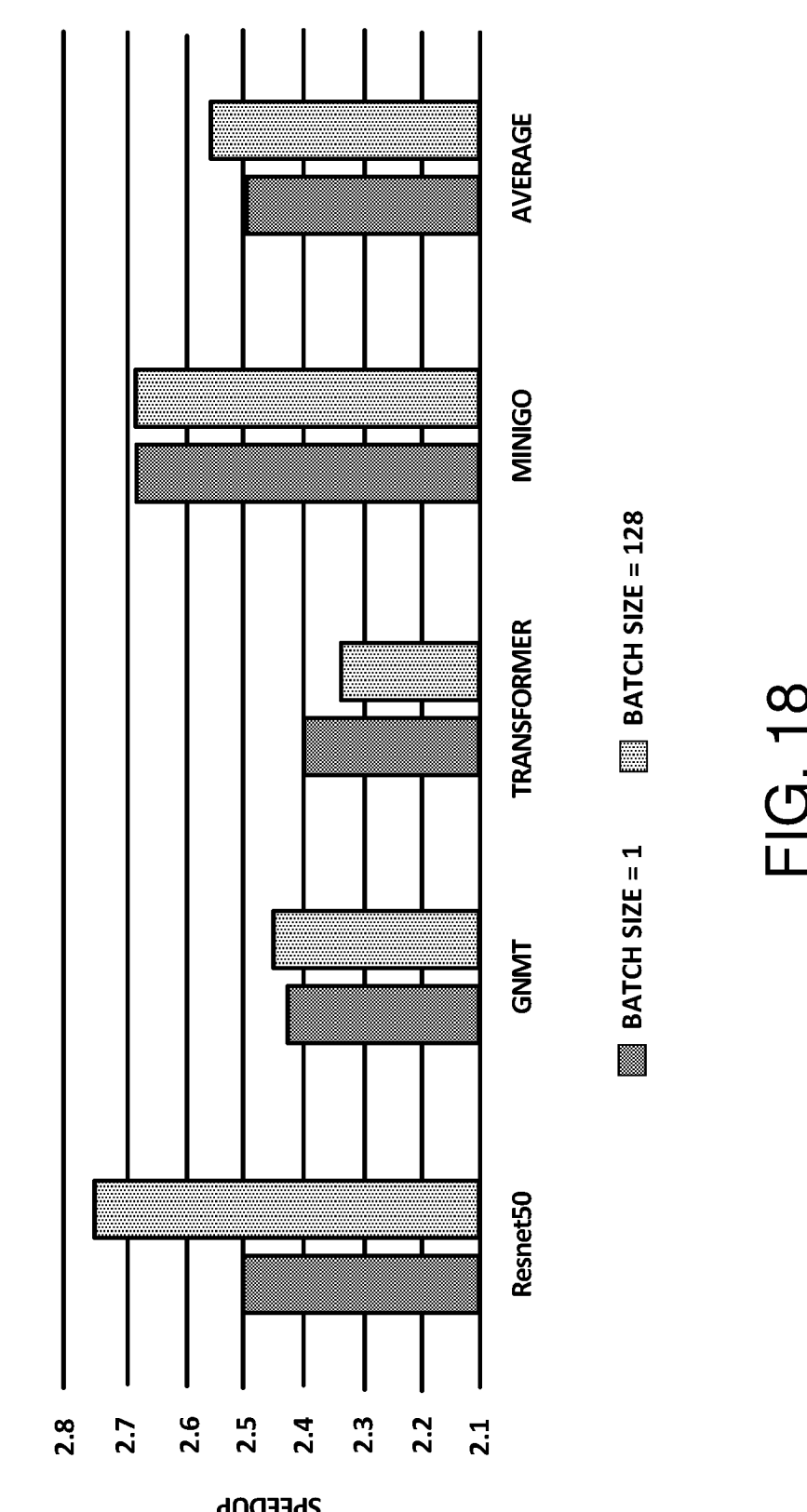
FIG. 18 illustrates the speedups for various networks that can be achieved with some embodiments of the present technology.

Using the analytical model described above, state-of-the-art networks from MLPerf were evaluated to measure the speedup of implementing them on an FPGA with hard matmuls vs. a regular FPGA. In these experiments, two batch sizes (1 and 128) were considered with only the forward pass, and the building block for the proposed FPGA was 4×4×4 matmul. Table 5 shows the time values obtained for these networks. For GEMM layers, we assumed the FPGA has enough resources for four 64×64×64 matrix multiplications to happen in parallel. For non-GEMM layers, we assumed DRAM bandwith of 100 GB/s. These numbers were used considering that our baseline architecture is a Stratix IV architecture, which was in use in 2008-2009 timeframe. FIG. 18 is a plot 1800 comparing the time taken and area required to compose smaller matrix multiplier blocks to form larger matrix multipliers, by using different approaches. On average, a speedup of 2.5× was obtained by using an FPGA with hard matrix multiplier blocks 7.

Architecture is a science of trade-offs. In accordance with various embodiments, the speedup and area benefits from FPGAs with hard matrix multiplier building blocks are substantial. But there are some limitations as well.

TABLE 5

Time (in ms) taken for various networks

| Network | GEMM layers (FPGA with DSP slices) | GEMM layers (FPGA with matmuls) | Non-GEMM layers |
|---|---|---|---|
| | | Batch size = 1 | |
| Resnet50 | 9.08 | 3.11 | 1.14 |
| GNMT | 35.72 | 12.24 | 3.43 |
| Transformer | 59.21 | 20.29 | 2.67 |
| Minigo | 0.054 | 0.018 | 0.0063 |

TABLE 5-continued

| | Time (in ms) taken for various networks | | |
|---|---|---|---|
| Network | GEMM layers (FPGA with DSP slices) | GEMM layers (FPGA with matmuls) | Non-GEMM layers |
| | Batch size = 128 | | |
| Resnet50 | 1143.00 | 391.84 | 167.00 |
| GNMT | 994.95 | 341.09 | 31.53 |
| Transformer | 7568.68 | 2594.72 | 342.92 |
| Minigo | 7.47 | 2.54 | 0.813 |

Various embodiments of the present technology, make the FPGA slightly less flexible than a regular FPGA. For a fixed area, adding hard matrix multiplier blocks means lesser number of CLBs, DSP slices and BRAMs can fit onto the FPGA. So, the amount of general purpose resources available on the FPGA get reduced, thereby making the FPGA slightly less attractive for applications that don't require matrix multiplications. But FPGAs already come in multiple variants and these FPGAs could be sold as AI/ML specialized FPGAs.

One advantage provided by some embodiments of the FPGAs is that logic can be designed to perform mathematical operations in any precision. With regards to AI/ML applications, using custom data types like int4 has been identified to be sufficient in many scenarios. In some cases, custom data types have proved to be better than regular data types, like bfloat16 over float16. Providing hard matrix multipliers on an FPGA means freezing the decision about which precisions will be supported at the FPGA design and fabrication time. This reduces the flexibility of the FPGA.

Some embodiments can use systolic matrix multipliers which have some limitations like no direct support for sparsity. As better architectures are identified, hard matrix multipliers could use those architectures. Also, variants of FPGAs with different architectures/implementations of matrix multipliers could be designed.

FIG. 19 is flow chart of a method 101 for configuring a programmable integrated circuit that may be used in some embodiments of the present technology. Method 101 can include the step of receiving 103 configuration bits at a configuration memory inside of a programmable integrated circuit having field programmable interconnect resources and a set of multiple hard matrix multipliers with programmable interconnects between the hard matrix multipliers and the field programmable interconnect resources neighboring the set of hard matrix multipliers. In an embodiment, the configuration bits connect or disconnect one field programmable interconnect resource with another field programmable interconnect resource within the programmable integrated circuit. Method 101 can also include the step of setting 105, based on the configuration bits, the field programmable interconnect resources within the programmable integrated circuit.

Figure 20:
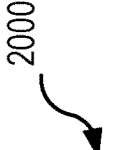
FIG. 20 is an example of a high level block diagram.

FIG. 20 is an example of a high level diagram 2000 of a computing device 57 that may be used for implementing or operating at least some of the above described embodiments of the programmable integrated circuit (e.g., FPGA) 1 and associated methods (e.g., method 101). Computing device 57 includes a processor 59 and a memory storage device 61 coupled to processor 59. Memory storage device 61 can include a non-transitory processor-readable storage medium. Memory storage device 61 may have stored thereon instructions and data for a machine learning application.

Computing device 57 can include one or more programmable integrated circuit(s) 1 (e.g., FPGA(s)) according to the present technology. Programmable integrated circuit 1 can be communicably coupled to memory storage device 61 and also communicably coupled to processor 59. Under control of processor 59 executing instructions stored in, for instance, non-transitory media of memory storage device 61, programmable integrated circuit 1 can perform various tasks from the machine learning application within the programmable integrated circuit 1.

Programmable integrated circuit 1 can include input 63 and output 65 pins, and can also include at least one configuration memory device (cell(s) 15) to receive a set of configuration bits via the input 63 and output 65 pins. Programmable integrated circuit 1 can include field programmable interconnect resources 3. In an example, the set of configuration bits provide an indication of which of the field programmable resources 3 to connect or disconnect within programmable integrated circuit 1. Programmable integrated circuit 1 can also include a set 67 of multiple hard matrix multipliers 7 with programmable interconnects 9 between the hard matrix multipliers 7 and the field programmable interconnect resources 3 neighboring the set 67 of hard matrix multipliers 7.

Various embodiments of the present technology can accelerate the compute part of matrix multiplications. For example, matrix multiplication involves memory reads and writes, and this proposal doesn't speedup (or slow down) these memory operations. An FPGA containing hard matrix multiplier blocks, in accordance with various embodiments, will have exactly the same memory read/write characteristics as a regular FPGA.

Adding new building blocks and adding building blocks of new geometries and sizes to existing FPGA fabric means adding more heterogeneity to FPGA architectures. This increases the complexity of software needed to synthesize and implement designs on such FPGAs. Significant cost is associated with writing, testing and deploying such software. This is a challenge in deploying such FPGAs commercially. Various embodiments of the matrix multiplier blocks can support multiple precisions, but use the smallest area. To deploy an FPGA containing hard matrix multiplier blocks, FPGA tool chains will have to support these blocks. One aspect of making the deployment of such FPGAs easier is automatically breaking down large matrix multiplications into small matrix multiplier blocks.

FPGAs are a great solution for accelerating AI/ML applications because of their capability to be configured as massive parallel computing engines providing high performance and energy efficiency. The configurability provided by FPGAs makes them even more attractive, because the software algorithms and hardware designs in this field are constantly evolving. The enormous flexibility offered by FPGAs, unfortunately, reduces the potential that can be achieve with FPGAs because although extremely generic building blocks means any logic using FPGAs can be designed, it also means that the designed logic operates at slower frequencies and consumes a lot of Silicon area (implying more power consumption). With the knowledge that matrix multiplications form the bulk of operations required for machine learning algorithms, various embodiments of the present technology add hard matrix multipliers as building blocks in FPGAs. This does reduce the flexibility of the FPGAs, but with the abundance of AI/ML applications where FPGAs can be deployed, it is a cost worth paying.

Aspects of the present technology will now be described further with reference to the following numbered clauses:

1. A programmable integrated circuit for implementing machine learning algorithms in hardware, the programmable integrated circuit comprising:
   field programmable interconnect resources,
   wherein the field programmable interconnect resources include configuration memory cells; and
   a set of multiple hard matrix multipliers.

2. The programmable integrated circuit of clause 1, further comprising programmable interconnects between at least some of the hard matrix multipliers.

3. The programmable integrated circuit of clause 1 or clause 2, further comprising programmable interconnects between the hard matrix multipliers and the field programmable resources neighboring the set of multiple hard matrix multipliers.

4. The programmable integrated circuit of any one of clauses 1-3, wherein at least one of the multiple hard matrix multipliers includes:
   a systolic array-based implementation of processing elements to compute an output matrix;
   a systolic data setup circuit to prepare and provide data from: adjacent matrix multiplier blocks, or other field programmable interconnect resources, or external input pins to the processing elements; and
   an output data interface circuit to write the data to an output.

5. The programmable integrated circuit of clause 4, wherein at least one of the multiple hard matrix multipliers includes programmable interconnects to combine small systolic matrix multipliers to form larger systolic matrix multipliers.

6. The programmable integrated circuit of any one of clauses 1-5, wherein the field programmable resources further include memory blocks.

7. The programmable integrated circuit of clause 6, wherein the memory blocks include embedded random access memories (RAMs) having programmable width and depth.

8. The programmable integrated circuit of clause 6 or clause 7, wherein at least one of the memory blocks of the field programmable interconnect resources has stored thereon matrices to be used as inputs to the set of multiple hard matrix multipliers.

9. The programmable integrated circuit of any one of clauses 1-8, wherein the field programmable interconnect resources further includes logic blocks.

10. The programmable integrated circuit of clause 9, wherein the logic blocks are generic logic blocks comprising of look-up tables or multiplexers that can be used to implement any logic.

11. The programmable integrated circuit of any one of clauses 1-10, wherein the field programmable resources further include digital signal processing (DSP) blocks.

12. The programmable integrated circuit of clause 11, wherein the DSP blocks contain embedded adders and multipliers that can also be configured for multiply-and-accumulate operations.

13. The programmable integrated circuit of any one of clauses 1-12, further comprising machine learning-centric (ML-centric) configurable logic blocks (CLBs).

14. The programmable integrated circuit of clause 13, wherein the ML-centric CLBs include: at least one divider, or at least one exponential calculator.

15. A programmable circuit for implementing machine learning algorithms, the programmable circuit comprising:
   field programmable interconnect resources; and
   a systolic matrix multiplier composed of multiple smaller systolic matrix multipliers,
   wherein the systolic matrix multiplier is connected to the field programmable interconnect resources;
   wherein each of the smaller systolic matrix multipliers includes programmable interconnect circuitry allowing the smaller systolic matrix multipliers to access the field programmable interconnect resources;
   wherein each of the smaller systolic matrix multipliers connect to adjacent smaller systolic matrix multipliers using a programmable interconnect; and
   wherein each of the smaller systolic matrix multipliers can function independently by themselves or as a part of one or more larger systolic matrix multipliers.

16. The programmable circuit of clause 15, wherein each of the smaller systolic matrix multipliers includes a control unit, and wherein control units of each of the multiple smaller systolic matrix multipliers are interconnected to create a larger control unit for the systolic matrix multiplier.

17. A programmable circuit for machine learning optimization, the programmable circuit comprising:
   multiple matrix multiplier blocks;
   memory blocks; and
   hard activation blocks connected to the memory blocks using programmable interconnects,
   wherein the hard activation blocks are configured to receive inputs from a first connected memory block and store an output to a second connected memory block.

18. The programmable circuit of clause 17, wherein the hard activation blocks are connected using programmable interconnects to a group of the multiple matrix multiplier blocks, each of the multiple matrix multiplier blocks configured to multiply a matrix of a first size with another matrix of a compatible size to generate a product matrix.

19. The programmable circuit of clause 17 or clause 18, wherein each of the multiple matrix multiplier blocks is interconnected to neighboring matrix multiplier blocks via the programmable interconnects to allow multiplication of matrices having a size larger than the first size.

20. The programmable circuit of any one of clauses 17-19, wherein the output is fed to a first processing block and an input is coming from a second processing block.

21. The programmable circuit of any one of clauses 17-20, configured to perform machine learning operations including relu, softmax, sigmoid, tanh, adding two matrices or vectors elementwise, multiplying two matrices or vectors elementwise, multiplying all elements of a matrix or a vector with a constant, or averaging all elements of a matrix or a vector.

22. The programmable circuit of any one of clauses 17-21, further comprising a group of multiple matrix multiplier blocks configured to receive inputs from field programmable interconnects, memory blocks, logic blocks, and neighboring multiplier blocks using programmable interconnects.

23. The programmable circuit of any one of clauses 17-21, further comprising a group of multiple matrix multiplier blocks configured to receive inputs from field programmable interconnects, memory blocks, logic blocks, and neighboring multiplier blocks without using programmable interconnects.

24. The programmable circuit of clause 22 or clause 23, wherein each matrix multiplier block of the group of multiple matrix multiplier blocks is configured to send output to programmable interconnects, memory blocks, and neighboring matrix multiplier blocks using programmable interconnects.

25. The programmable circuit of clause 22 or clause 23, wherein each matrix multiplier block of the group of multiple matrix multiplier blocks is configured to send output to programmable interconnects, memory blocks, and neighboring matrix multiplier blocks without using programmable interconnects.

26. The programmable circuit of any one of clauses 17-25, wherein data stored within the memory blocks is of: type integer, or type fixed point, or type floating point.

27. A method for configuring a programmable integrated circuit:

receiving configuration bits at a configuration memory inside of a programmable integrated circuit having field programmable interconnect resources and a set of multiple hard matrix multipliers with programmable interconnects between the hard matrix multipliers and the field programmable interconnect resources neighboring the set of hard matrix multipliers, wherein the configuration bits connect or disconnect one field programmable interconnect resource with another field programmable interconnect resource within the programmable integrated circuit; and setting, based on the configuration bits, the field programmable interconnect resources within the programmable integrated circuit.

28. A computing device, comprising:

a processor;

a memory having stored thereon: data, and instructions for execution by the processor; and a programmable integrated circuit communicably coupled to the memory and the processor, wherein the programmable integrated circuit includes:

input and output pins;

a configuration memory to receive a set of configuration bits via the input and output pins;

field programmable interconnect resources, wherein the set of configuration bits provide an indication of which of the field programmable resources to connect or disconnect within the programmable integrated circuit; and a set of multiple hard matrix multipliers with programmable interconnects between the hard matrix multipliers and the field programmable interconnect resources neighboring the set of hard matrix multipliers.

29. The computing device of clause 28, wherein the data and instructions stored on the memory include data or instructions for a machine learning application.

30. The computing device of clause 29, wherein the programmable integrated circuit is configured to perform various tasks from the machine learning application within the programmable integrated circuit.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or blocks are presented in a given order, alternative implementations may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed or implemented in parallel, or may be performed at different times. Further any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology may be recited in a particular claim format (e.g., system claim, method claim, computer-readable medium claim, etc.), other aspects may likewise be embodied in those claim formats, or in other forms, such as being embodied in a means-plus-function claim. Any claims intended to be treated under 35 U.S.C. § 112(f) will begin with the words "means for", but use of the term "for" in any other context is not intended to invoke treatment under 35 U.S.C. § 112(f). Accordingly, the applicant reserves the right to pursue additional claims after filing this application to pursue such additional claim forms, in either this application or in a continuing application.

What is claimed is:

1. A programmable integrated circuit for implementing machine learning algorithms in hardware, the programmable integrated circuit comprising:

field programmable interconnect resources, wherein the field programmable interconnect resources include configuration memory cells; and a set of multiple hard matrix multipliers, wherein at least one of the multiple hard matrix multipliers includes:

a systolic array-based implementation of a set of processing elements to compute an output matrix;

a systolic data setup circuit to prepare and provide data from adjacent matrix multiplier blocks, other field programmable interconnect resources, and external input pins to the processing elements; and an output data interface circuit to write the data to an output.

2. The programmable integrated circuit of claim 1, further comprising programmable interconnects between at least some of the multiple hard matrix multipliers.

3. The programmable integrated circuit of claim 1, further comprising programmable interconnects between the hard matrix multipliers and the field programmable resources neighboring the set of multiple hard matrix multipliers.

4. The programmable integrated circuit of claim 1, wherein at least one other multiple hard matrix multiplier of the set of multiple hard matrix multipliers includes:

a further systolic array-based implementation of a further set of processing elements to compute a further output matrix;

a further systolic data setup circuit to prepare and provide further data from one or more of adjacent matrix multiplier blocks, other field programmable interconnect resources, and external input pins to the processing elements; and a further output data interface circuit to write the further data to a further output.

5. The programmable integrated circuit of claim 4, wherein the at least one of the multiple hard matrix multipliers and the at least one other multiple hard matrix multiplier include programmable interconnects providing direct connections from corresponding ones of the set of processing elements and the further set processing elements to combine small systolic matrix multipliers to form larger systolic matrix multipliers.

6. The programmable integrated circuit of claim 1, wherein the field programmable resources further include memory blocks.

7. The programmable integrated circuit of claim 6, wherein the memory blocks include embedded random access memories (RAMs) having programmable width and depth.

8. The programmable integrated circuit of claim 6, wherein at least one of the memory blocks of the field programmable interconnect resources has stored thereon matrices to be used as inputs to the set of multiple hard matrix multipliers.

9. The programmable integrated circuit of claim 1, wherein the field programmable interconnect resources further include logic blocks.

10. The programmable integrated circuit of claim 9, wherein the logic blocks are generic logic blocks comprising look-up tables or multiplexers that can be used to implement logic.

11. The programmable integrated circuit of claim 1, wherein the field programmable resources further include digital signal processing (DSP) blocks.

12. The programmable integrated circuit of claim 11, wherein the DSP blocks include embedded adders and multipliers that can also be configured for multiply-and-accumulate operations.

13. The programmable integrated circuit of claim 1, further comprising machine learning-centric (ML-centric) configurable logic blocks (CLBs).

14. The programmable integrated circuit of claim 13, wherein the ML-centric CLBs include one or more of a divider and an exponential calculator.

* * * * *